(12) United States Patent
Jambunathan et al.

(10) Patent No.: US 11,404,575 B2
(45) Date of Patent: Aug. 2, 2022

(54) DIVERSE TRANSISTOR CHANNEL MATERIALS ENABLED BY THIN, INVERSE-GRADED, GERMANIUM-BASED LAYER

(71) Applicant: INTEL CORPORATION, Santa Clara, CA (US)

(72) Inventors: Karthik Jambunathan, Hillsboro, OR (US); Cory C. Bomberger, Portland, OR (US); Glenn A. Glass, Portland, OR (US); Anand S. Murthy, Portland, OR (US); Ju H. Nam, Hillsboro, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/611,921

(22) PCT Filed: Jun. 30, 2017

(86) PCT No.: PCT/US2017/040317
§ 371 (c)(1),
(2) Date: Nov. 8, 2019

(87) PCT Pub. No.: WO2019/005111
PCT Pub. Date: Jan. 3, 2019

(65) Prior Publication Data
US 2020/0411691 A1 Dec. 31, 2020

(51) Int. Cl.
*H01L 21/70* (2006.01)
*H01L 29/78* (2006.01)
(Continued)

(52) U.S. Cl.
CPC ...... *H01L 29/7849* (2013.01); *H01L 27/0924* (2013.01); *H01L 29/161* (2013.01)

(58) Field of Classification Search
CPC ............... H01L 29/7849; H01L 29/161; H01L 27/0924; H01L 21/823807;
(Continued)

(56) References Cited

U.S. PATENT DOCUMENTS

2003/0107032 A1* 6/2003 Yoshida ............ H01L 21/02505
257/19
2009/0081839 A1 3/2009 Chu
(Continued)

FOREIGN PATENT DOCUMENTS

WO 2019005111 A1 1/2019

OTHER PUBLICATIONS

International Search Report and Written Opinion received for PCT Application No. PCT/US2017/040317, dated Feb. 23, 2018. 16 pages.
International Preliminary Report on Patentability received for PCT Application No. PCT/US2017/040317, dated Dec. 21, 2019. 11 pages.

*Primary Examiner* — Calvin Y Choi
(74) *Attorney, Agent, or Firm* — Schwabe, Williamson & Wyatt, P.C.

(57) ABSTRACT

Techniques are disclosed for forming diverse transistor channel materials enabled by a thin, inverse-graded, germanium (Ge)-based layer. The thin, inverse-graded, Ge-based layer (e.g., having a thickness of at most 500 nm) can then serve as a template for the growth of compressively strained PMOS channel material and tensile strained NMOS channel material to achieve gains in hole and electron mobility, respectively, in the channel regions of the devices. Such a relatively thin Ge-based layer can be formed with suitable surface quality/relaxation levels due to the inverse grading of the Ge concentration in the layer, where the Ge concentration is relatively greatest near the substrate and relatively lowest near the overlying channel material layer. In addition to the inverse-graded Ge concentration, the Ge-based layer
(Continued)

may be characterized by the nucleation, and predominant containment, of defects at/near the interface between the substrate and the Ge-based layer.

20 Claims, 10 Drawing Sheets

(51) Int. Cl.
*H01L 27/092* (2006.01)
*H01L 29/161* (2006.01)

(58) Field of Classification Search
CPC ... H01L 29/16–1608; H01L 29/04–045; H01L 29/36–365; H01L 29/66818
USPC .......................................................... 257/369
See application file for complete search history.

(56) References Cited

U.S. PATENT DOCUMENTS

| | | |
|---|---|---|
| 2013/0005106 A1 | 1/2013 | Tezuka et al. |
| 2015/0179796 A1* | 6/2015 | Sung ..................... H01L 29/045 257/288 |
| 2015/0206970 A1 | 7/2015 | Lin et al. |
| 2015/0228795 A1* | 8/2015 | Yang ................... H01L 29/7855 327/435 |
| 2016/0027875 A1* | 1/2016 | Kim .................. H01L 21/02236 257/401 |
| 2016/0181414 A1* | 6/2016 | Huang .................. H01L 29/785 257/401 |
| 2016/0293601 A1 | 10/2016 | Majhi et al. |
| 2017/0062426 A1* | 3/2017 | Loubet ............... H01L 29/0649 |

* cited by examiner

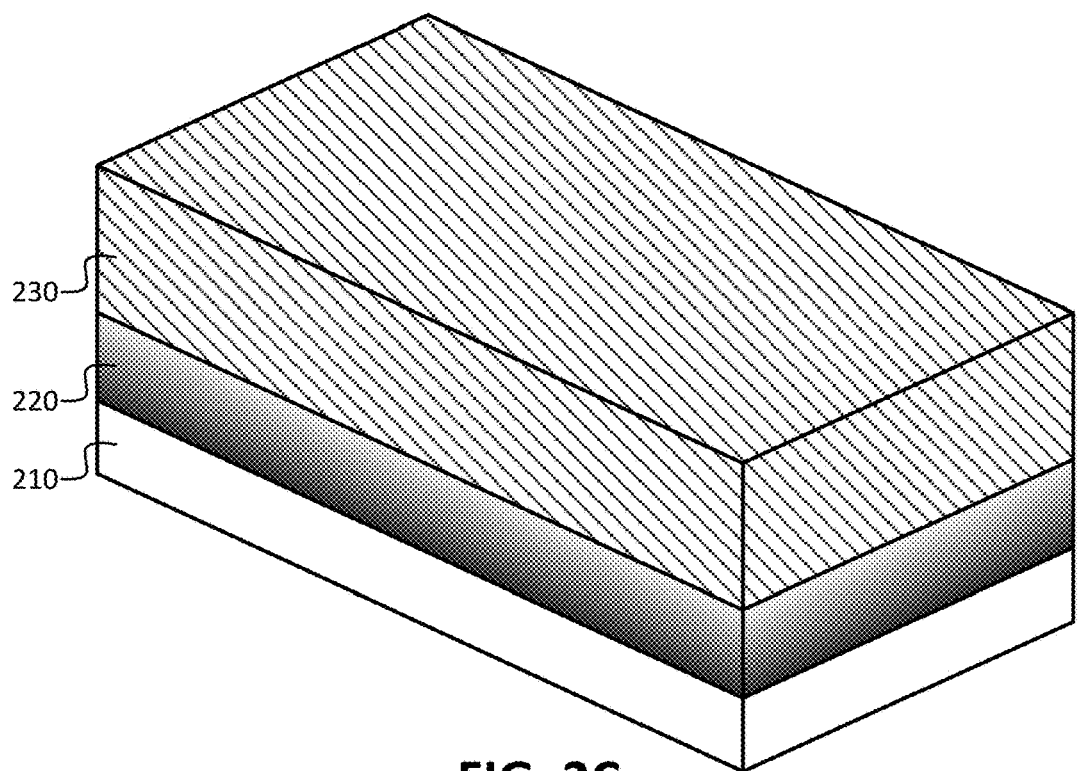
FIG. 2C
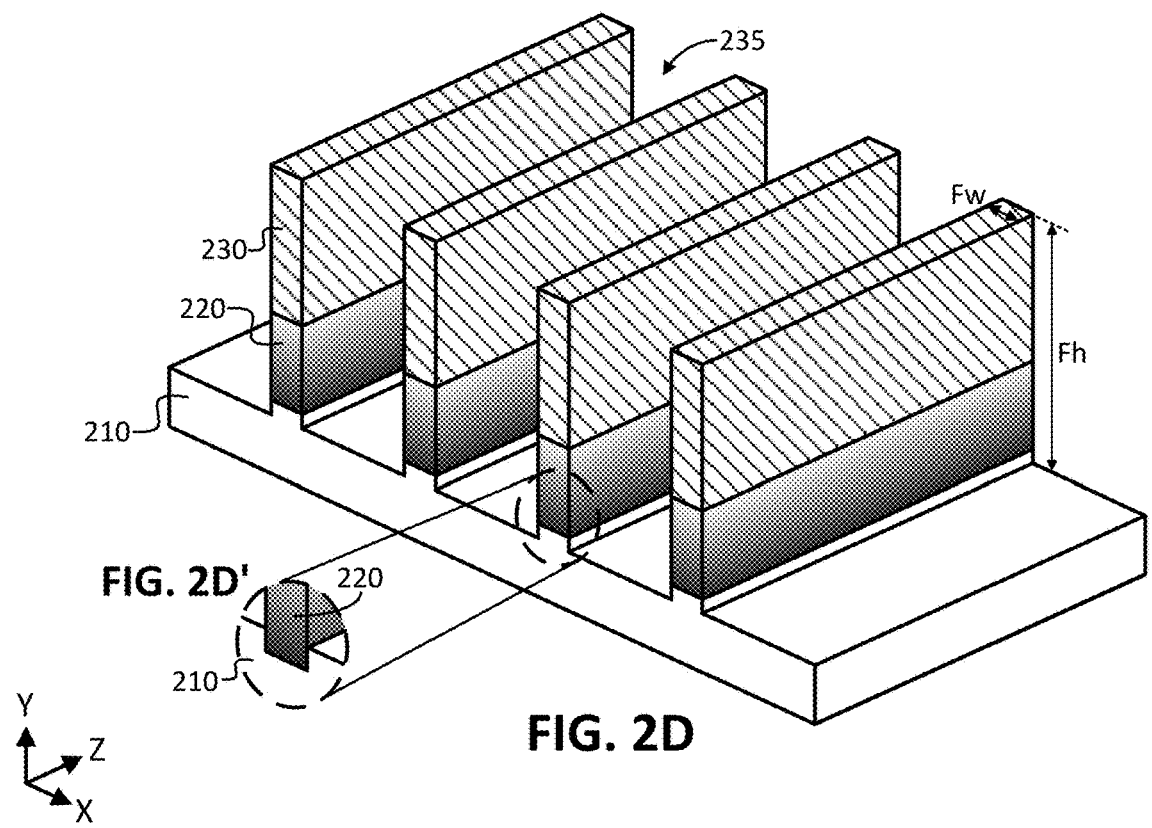
FIG. 2D'
FIG. 2D

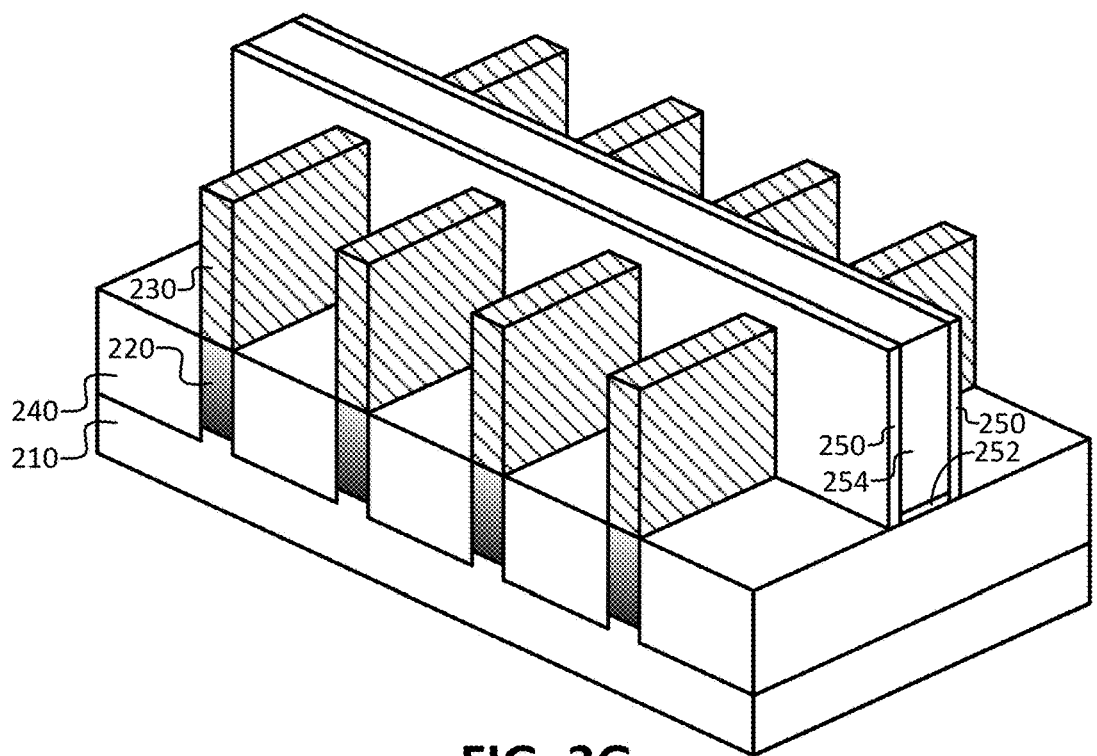
FIG. 3G
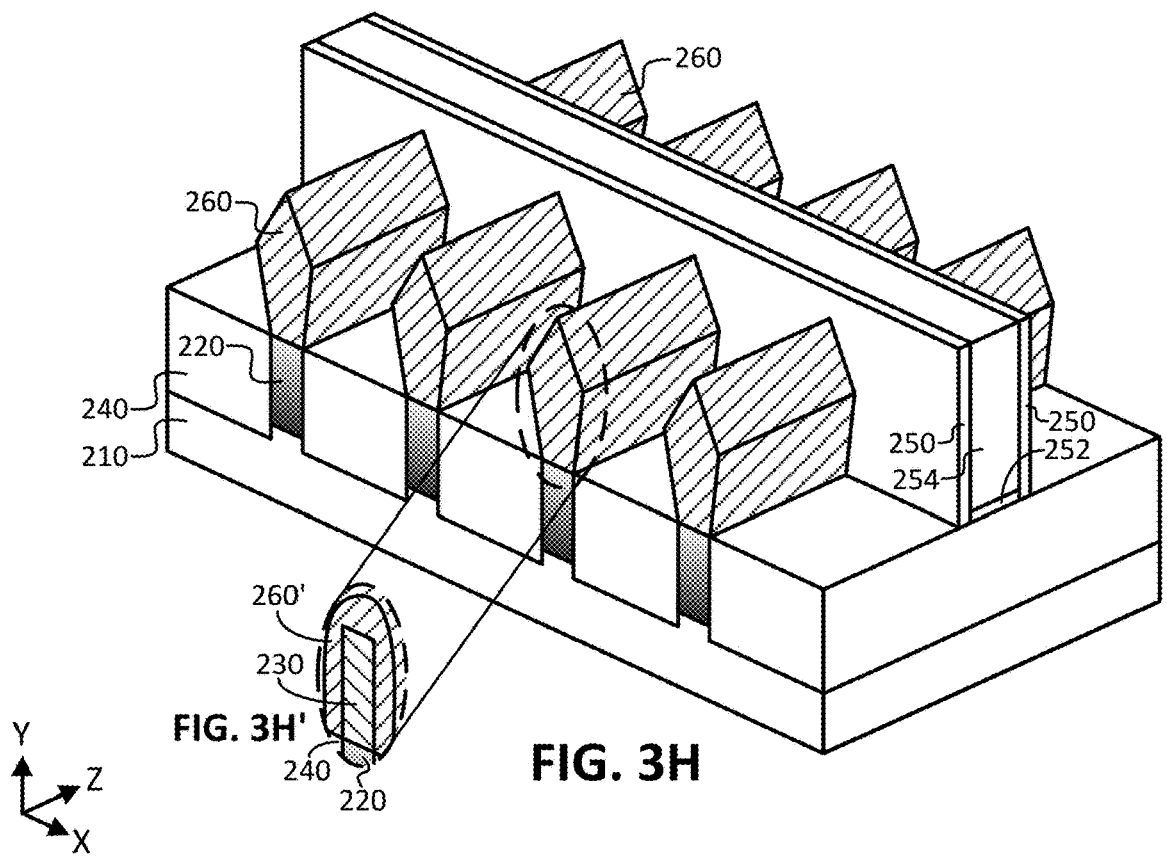
FIG. 3H'
FIG. 3H

Defects (211) Nucleating at Substrate (210)/Ge-Based Layer (220) Interface

DIVERSE TRANSISTOR CHANNEL MATERIALS ENABLED BY THIN, INVERSE-GRADED, GERMANIUM-BASED LAYER

CROSS-REFERENCE TO RELATED APPLICATION

This patent application is a U.S. National Phase Application under 35 U.S.C. § 371 of International Application No. PCT/US2017/040317, filed Jun. 30, 2017, entitled "DIVERSE TRANSISTOR CHANNEL MATERIALS ENABLED BY THIN, INVERSE-GRADED, GERMANIUM-BASED LAYER," which designates the United States of America, the entire disclosure of which is hereby incorporated by reference in its entirety and for all purposes.

BACKGROUND

Semiconductor devices are electronic components that exploit the electronic properties of semiconductor materials, such as silicon (Si), germanium (Ge), and gallium arsenide (GaAs). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow between the source and drain. In instances where the charge carriers are electrons, the FET is referred to as an n-channel device, and in instances where the charge carriers are holes, the FET is referred to as a p-channel device. Some FETs have a fourth terminal called the body or substrate, which can be used to bias the transistor. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (PMOS) and n-channel MOSFET (NMOS) devices to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer regions of the fin (e.g., top and two sides), such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin). Generally, such multiple-gate FETs may be referred to as MuGFETs. A nanowire transistor (sometimes referred to as a gate-all-around (GAA) or nanoribbon transistor) is configured similarly to a fin-based transistor, but instead of a finned channel region where the gate is on three portions (and thus, there are three effective gates), one or more nanowires are used for the channel region and the gate material generally surrounds each nanowire.

BRIEF DESCRIPTION OF THE DRAWINGS

FIGS. 2A-D illustrate example IC structures formed when carrying out some of the method of FIG. 1 using a blanket deposition approach, in accordance with some embodiments of the present disclosure. Note that the example structures of FIGS. 2A-D continue on to the example structures of FIGS. 3E-J.

FIG. 2B' illustrates a blown-out portion of FIG. 2B showing a multilayer Ge-based layer formed with a stepwise or incremental approach, in accordance with some embodiments.

FIG. 2D' illustrates a blown-out portion of FIG. 2D showing an alternative patterning process where the etch processing stops before reaching the substrate/Ge-based layer interface, in accordance with some embodiments.

FIGS. 3A-J illustrate example IC structures formed when carrying out the method of FIG. 1 using a replacement fin-based approach, in accordance with some embodiments of the present disclosure.

FIG. 3F' illustrates a blown-out portion of FIG. 3F showing an alternative shallow trench isolation (STI) material recess location, in accordance with some embodiments.

FIG. 3H' illustrates a blown-out portion of FIG. 3H showing a source/drain region formed using a cladding scheme, in accordance with some embodiments.

Figure 1:
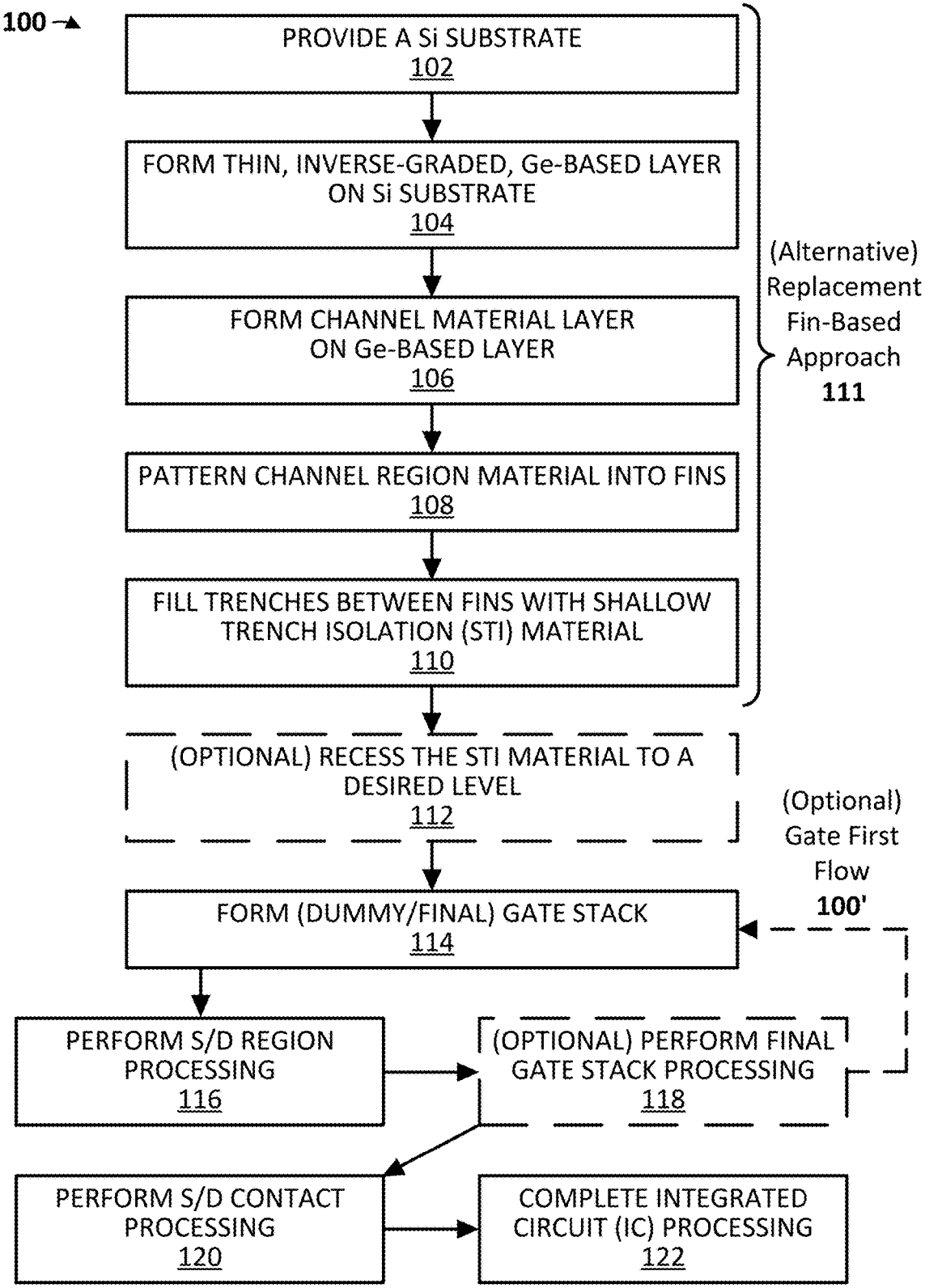
FIG. 1 illustrates a method of forming an integrated circuit (IC) including diverse transistor channel material enabled by a thin, inverse-graded, germanium (Ge)-based layer.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

In the context of transistors, for many integrated circuit (IC) applications, it is desired to increase the mobility of the charge carriers in the channel. For instance, for PMOS devices in such applications, it is desired to increase the mobility of holes in the channel, and for NMOS devices in such applications, it is desired to increase the mobility of electrons in the channel. A technique for increasing charge carrier (e.g., hole or electron) mobility is to impart strain on the channel region of the transistor via the source/drain (S/D) regions. However, as transistors shift to non-planar configurations and scale down to have smaller critical dimensions, such as smaller gate lengths (e.g., sub-100 nanometer (nm) or sub-50 nm gate lengths), the aforementioned strain technique is not effective due to poor mechanical coupling between the channel and the S/D regions. This limits the channel mobilities capable of being achieved to a relatively lower value. In addition, the use of a Si substrate, which is standard for many IC applications, further limits the ability to impart strain on transistor channel regions, as Si provides a single lattice constant or parameter value from which to form subsequent semiconductor material. Accordingly, it can be difficult to form different channel region materials with different strain values, particularly for CMOS applications that utilize both NMOS and PMOS devices.

For instance, NMOS and PMOS devices generally perform better using different materials for the different devices, as different materials can achieve different carrier mobilities depending on whether the carriers are electrons (in the case of NMOS) or holes (In the case of PMOS). For example, in the context of using group IV semiconductor material for transistor channel regions, Si or low-Ge content SiGe is generally preferred for NMOS devices and high-Ge content SiGe or Ge is preferred for PMOS devices. Further, NMOS devices generally perform better with increased tensile strain in the channel region and PMOS devices generally perform better with increased compressive strain in the channel region. Current techniques attempt to achieve the combination of the different strained materials by growing a very thick buffer layer (e.g., 0.5-1 microns, or even thicker) of relaxed SiGe on Si in an attempt to provide the required seeding layer from which to grow the different transistor channel materials while maintaining the preferred strain. Such a thick buffer layer is employed to attain the high relaxation percentage and low surface dislocation density required to provide a suitable seeding layer surface from which to grow the different strained channel region materials. However, employing such a thick buffer layer causes wafer bowing downstream in the IC fabrication process, which is highly undesirable as it can create and/or exacerbate defects and dislocations within the IC devices. Alternatively, employing a relatively thinner buffer layer (e.g., having a thickness of at most 0.5 micron or 500 nm) would cause defects within the thinner buffer layer to propagate to its top surface, thereby affecting the quality of the top surface of the thinner buffer layer. Further, if transistor channel material is grown from that top surface of the thinner buffer layer in an effort to impart strain on the channel material, then the defects would propagate from the top surface of the thinner buffer layer into the channel material, resulting in the loss of strain and thereby degrading charge carrier mobility.

Thus, and in accordance with various embodiments of the present disclosure, techniques are provided for forming diverse transistor channel materials enabled by a thin, inverse-graded, germanium (Ge)-based layer. In some embodiments, the thin, inverse-graded, Ge-based layer, may serve as a template for the growth of compressively strained PMOS channel material and tensile strained NMOS channel material to achieve gains in hole and electron mobility, respectively, in the channel regions of the devices. Note that the thin, inverse-graded, Ge-based layer as described herein may be referred to herein as simply a thin Ge-based layer, an inverse-graded Ge-based layer, or a Ge-based layer. In some embodiments, the Ge-based layer described herein may include a thickness of at most 500 nm to help with wafer bowing issues that arise from use of buffer layers that are greater than 500 nm, for example. In some such embodiments, such a relatively thin Ge-based layer can be formed with suitable surface quality/relaxation levels due to inverse-graded germanium concentration (e.g., Ge fraction of the layer decreasing with thickness away from the Si substrate interface) in the Ge-based layer that serves to generate and effectively trap defects near the substrate/Ge-based layer interface. Thus, by generating the defects at the substrate/Ge-based layer, the Ge-based layer can relax (at least in part) toward its material bulk lattice constant value, while the grading of the Ge concentration can effectively trap those defects (at least in part) near the substrate/Ge-based interface to prevent them from reaching the top surface of the Ge-based layer and from reaching the overlying channel material layer.

Therefore, the Ge-based layer as described herein enables the formation of one or more channel material layers thereon for a multitude of transistor-based applications, as will be apparent in light of this disclosure. For instance, in an example embodiment, the techniques described herein allow for the growth of a thin (e.g., less than 250 nm thick), relaxed (e.g., with greater than 80% relaxation) SiGe layer (e.g., with a Ge content of less than 35% by atomic percentage at the top surface of the layer) with a low top surface dislocation density (e.g., less than 1E7 atoms per square centimeter) on a Si substrate. In such an example embodiment, the Ge-based layer (e.g., with 30% Ge content by atomic percentage or $Si_{0.7}Ge_{0.3}$ at the top surface) can serve as the template for the growth of compressively strained SiGe channel PMOS devices (e.g., with 50% or 60% Ge content by atomic percentage) and tensile strained Si channel NMOS devices, thereby simultaneously achieving large gains in hole mobility for the PMOS devices and electron mobility for the NMOS devices, which improves the performance of the devices. Further, in such an example embodiment, the PMOS and NMOS devices may be included in a CMOS circuit, where the techniques described herein help facilitate the co-integration (particularly in close proximity) of high-performance PMOS and NMOS devices. Note that although the substrate is referred to herein as a Si substrate, it may include doping in at least a portion of the substrate, in some embodiments. For instance, in some such embodiments, a top portion of the substrate may include p-type dopant (e.g., boron) and/or n-type dopant (e.g., phosphorous, arsenic). However, in other embodiments, the Si substrate may be intrinsic or undoped. Regardless, in some embodiments, the semiconductor material of the Si substrate may essentially consist of Si semiconductor material (with or without included dopant).

The Ge-based layer, in some embodiments, may include silicon and germanium that may or may not be alloyed with tin and/or carbon. The Ge-based layer is referred to herein as such because it at least includes germanium in at least a portion of the layer, and in some cases, throughout the entirety of the layer. For instance, in some embodiments, the Ge-based layer may include monocrystalline Ge or SiGe at the bottom (near the Si substrate), and then transition to SiGe with a relatively lower Ge concentration at the top (near the overlying channel material layer). In some embodiments, the Ge concentration of the Ge-based layer may be decreased or inverse-graded with a smooth gradient of the Ge concentration throughout the layer. For instance, in some such embodiments, the Ge concentration may be decreased as the Ge-based layer is being deposited (e.g., via in-situ processing), while the concentration of one or more other elements (e.g., Si, C, and/or Sn) may be increased as the Ge-based layer is deposited. In other embodiments, the Ge concentration of the Ge-based layer may be decreased or inverse-graded using a step-wise approach, where the Ge concentration is abruptly changed (e.g., with at least a 5 or 10% difference in Ge concentration) throughout the Ge-based layer. Such abrupt changes may happen in a layer-by-layer manner, such that the Ge-based layer includes a multilayer structure of progressively decreasing Ge concentration. In still other embodiments, a hybrid approach may be utilized, such as where a step-wise approach is used, but the Ge-concentration is also smoothly graded in at least one sub-layer.

In some embodiments, the decrease in Ge concentration, from the starting relatively high Ge concentration at the bottom (closest to the Si substrate) to the ending relatively low Ge concentration at the top (farthest from the Si substrate), may be in the range of 5-95%, may be approximately 5, 10, 15, 20, 25, 30, 35, 40, 45, 50, 55, 60, 65, 70, 75, 80, 85, 90, or 95%, and/or may be at least 5, 10, 15, 20, 25, 30, 35, 40, 45, 50, 55, 60, 65, 70, 75, 80, 85, 90, or 95%, for example. In the extreme example of the aforementioned range, the Ge-based layer would start as Ge and transition to $Si_{0.95}Ge_{0.05}$, for instance. To provide another example, the Ge-based layer may be linearly graded from $Si_{0.4}Ge_{0.6}$ (60% Ge concentration) at the substrate to $Si_{0.8}Ge_{0.2}$ (20% Ge concentration) at the channel material layer end, which would be a 40% decrease in Ge concentration, as can be understood. In such an example case, a $Si_{0.6}Ge_{0.4}$ channel material layer may be formed on the $Si_{0.8}Ge_{0.2}$ top seeding surface of the Ge-based layer. In embodiments where the Ge-concentration includes an inverse-graded Ge concentration based on a smooth gradient (e.g., where no distinct interfaces may not be present), the smooth gradient need not be consistent throughout the layer. For instance, in some such embodiments, the Ge concentration used when depositing the Ge-based layer may be first decreased at a first rate and then subsequently decreased at a second, different rate (e.g., fast decrease in Ge concentration at first followed by a slow decrease or slow decrease in Ge concentration at first followed by a fast decrease, and so forth).

In embodiments where the Ge-based layer includes an inverse-graded Ge concentration based on a step-wise approach (e.g., where distinct interfaces may be present), there may be 1, 2, 3, 4, 5, 6, 7, 8, 9 or more steps in the multilayer structure of the Ge-based layer, for example. Further, in embodiments where the Ge-based layer includes an inverse-graded Ge concentration based on a step-wise approach, the Ge-based layer may include a multilayer structure including 2, 3, 4, 5, 6, 7, 8, 9, 10 or more sub-layers, for example. For instance, if a two-step approach is applied (such that the multilayer structure includes three sub-layers), then the Ge-based layer may start with a first sub-layer of $Si_{0.4}Ge_{0.6}$ at the substrate, followed by a second sub-layer of $Si_{0.6}Ge_{0.4}$ formed on the first sub-layer, followed by a third sub-layer of $Si_{0.8}Ge_{0.2}$ formed on the second sub-layer, where that third sub-layer of the Ge-based layer provides a seeding surface of $Si_{0.8}Ge_{0.2}$ from which to form one or more channel material layers. Thus, the inverse-graded nature of the Ge-based layer variously described herein can be in any form, as long as there is an overall decrease in the Ge concentration going away from the substrate (which may equate to an overall increase in Si concentration going away from the substrate, in some embodiments).

In some embodiments, the Ge-based layer may or may not be doped with any suitable dopant (e.g., boron, phosphorous, and/or arsenic). In some embodiments, the Ge-based layer may be included, in part, in the channel region of one or more transistor devices. In other embodiments, the Ge-based layer may be completely below the channel region of a given transistor, where it is completely contained in a sub-channel or sub-fin region, for example. In some such embodiments, the Ge-based layer may be oppositely type doped relative to the overlying channel region material to provide a tunnel diode to help reduce or eliminate parasitic leakage (e.g., subthreshold leakage). For instance, in some embodiments, the Ge-based layer may be intentionally p-type doped (e.g., with a doping concentration of at least 1E16, 5E16, 1E17, 5E17, 1E18, 5E18, or 1E19 atoms per cubic cm) if the overlying channel region is to be n-type doped, or vice versa, where the Ge-based layer may be intentionally n-type doped (e.g., with a doping concentration of at least 1E16, 5E16, 1E17, 5E17, 1E18, 5E18, or 1E19 atoms per cubic cm) if the overlying channel region is to be p-type doped. In some embodiments, the Ge-based layer may include a vertical thickness in the range of 20-500 nm (or in a subrange of 20-50, 20-100, 20-200, 20-300, 20-400, 50-100, 50-200, 50-300, 50-400, 50-500, 100-250, 100-400, 100-500, 200-400, or 200-500 nm) and/or a maximum vertical thickness of at most 500, 450, 400, 350, 300, 250, 200, 150, 100, or 50 nm, for example. As can be understood based on this disclosure, employing a sub-500 nm Ge-based layer can help reduce or prevent undesired wafer bowing. Other suitable thickness values, ranges, and thresholds will be apparent in light of this disclosure.

As previously stated, by forming the Ge-based layer with inverse grading of the Ge concentration, the Ge-based layer can relax, at least in part, depending on the particular configuration. For instance, in some embodiments, the top surface or portion (e.g., top 1, 2, 3, 4, 5, 10, 15, 20, or 25%) of the Ge-based layer may relax to within 50, 45, 40, 35, 30, 25, 20, 15, 10, or 5% of the bulk lattice parameters of the material of that top surface or portion of the Ge-based layer, for example. By way of example, if the top surface of the Ge-based layer includes SiGe having a concentration of 30% Ge, which has a lattice constant of approximately 5.499 angstroms (Å) at 300 Kelvin (K), and it is formed on a Si substrate with a relaxation value to within 20% of its bulk lattice parameters, then that $Si_{0.7}Ge_{0.3}$ top surface of the Ge-based layer would have a lattice constant of approximately 5.485-5.499 Å at 300 K. Note that the top surface or portion of the Ge-based layer is the relevant surface/portion of concern for the techniques disclosed herein, because it is used as the template/seeding feature from which the channel material layer is formed. Therefore, by shifting the template/seeding surface lattice constant from which the channel material layer is formed (as opposed to the sole lattice constant of Si, which is 5.431 Å at 300 K), the techniques described herein enable a more diverse range of monocrystalline semiconductor material for transistor channels, and also allow such diverse material channel regions to maintain strain throughout the entirety of those channel regions, through material engineering.

As was also previously stated, in the IC stack of layers, the Ge-based layer causes the formation of defects (e.g., dislocations and/or stacking faults) that nucleate at the substrate/Ge-based layer interface and are predominantly contained within the Ge-based layer rather than running through to the overlying channel material layer. In other words, the majority of the defects do not reach the top surface of the Ge-based layer due to the inversely-graded nature of the Ge-based layer. Thus, regardless of how the inverse-graded Ge-based layer is formed (e.g., with a smooth gradient or in a step-wise manner), it can be characterized by the nucleation of defects (e.g., dislocations and/or stacking faults) which nucleate at the substrate/Ge-based layer interface and predominantly terminate prior to reaching the top portion/surface of the Ge-based layer. Therefore, the inverse-graded nature of the Ge-based layer (e.g., where the portion of the Ge-based layer nearest the Si substrate includes the highest Ge-concentration of that layer) releases the energy required to form such defects in the first instance, and thus, the Ge-based layer may be considered a high entropy layer. Without the inverse-graded nature of the Ge-based layer, forming a thin Ge-based layer (e.g., with a thickness of less than 500 nm) on a Si substrate would result in relatively more defects propagating to the top surface of the thin Ge-based layer, which is undesirable as previously described.

In some embodiments, the top portion/surface of the Ge-based layer may have a relatively low defect or dislocation density, such as less than 1E9 per square cm, which is the typical minimum threshold defect/dislocation density that would form at the top portion/surface of the thin Ge-based layer if the inverse-graded Ge concentration scheme as described herein were not employed. In some such embodiments, the top portion/surface of the Ge-based layer may have a defect/dislocation density of at most 1E9, 5E8, 1E8, 5E7, 1E7, 5E6, 1E6, 5E5, 1E5, 5E4, or 1E4 per square cm, for example. In some embodiments, the top portion/surface of the Ge-based layer may include essentially no defects or dislocations, as they may terminate prior to reaching that top portion/surface. Note that "aEb" as used herein equates to "a times 10 raised to the power of b", where 'a' and 'b' are real numbers. For example, 1E9 can also be expressed as 1 times 10 raised to the power of 9, or simply, 10 to the power of 9 (10^9). Also note that when the top portion/surface or surface/portion of the Ge-based layer is referred to herein, such description may pertain to the top-most surface of the Ge-based layer (e.g., the surface farthest from the Si substrate and closest to the channel material layer) and/or the top portion of the Ge-based layer (e.g., the top 1, 2, 3, 4, 5, 10, 15, or 20% of the Ge-based layer). Thus, reference to the top portion/surface or top surface/portion of the Ge-based layer may mean only the top surface of the Ge-based layer, only the top portion of the Ge-based layer, or both the top surface and the top portion of the Ge-based layer. Also note that in some cases, the defect/dislocation density may include the threading dislocation density. Accordingly, in some embodiments, the interface between the Ge-based layer and the top surface of the Si substrate may become less distinct or essentially merge together (e.g., as a result of the defects formed at that interface).

A channel material layer, in some embodiments, may be formed on the Ge-based layer to be used in the channel region of one or more transistors. In some such embodiments, the channel material layer may include any suitable semiconductor material, such as monocrystalline group IV and/or group III-V semiconductor material. The use of "group IV semiconductor material" (or "group IV material" or generally, "IV") herein includes at least one group IV element (e.g., silicon, germanium, carbon, tin), such as silicon (Si), germanium (Ge), silicon-germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (In-GaAs), indium aluminum arsenide (InAlAs), gallium phosphide (GaP), gallium antimonide (GaSb), indium phosphide (InP), gallium nitride (GaN), and so forth. Note that group III may also be known as the boron group or IUPAC group 13, group IV may also be known as the carbon group or IUPAC group 14, and group V may also be known as the nitrogen family or IUPAC group 15, for example. Also note that compositionally different as used herein with respect to semiconductor materials or features/layers/structures including semiconductor material means (at least) including different semiconductor materials or including the same semiconductor material but with a different compositional ratio (e.g., where the concentration of at least one component of the material is different). For instance, Ge is compositionally different than InGaAs (as they are different semiconductor materials), but $Si_{0.7}Ge_{0.3}$ is also compositionally different than $Si_{0.4}Ge_{0.6}$ (as they include different compositional ratios). Moreover, SiGe with a Ge concentration in the range of 0 to 30 atomic percentage is compositionally different than SiGe with a Ge concentration in the range of 31 to 100 atomic percentage.

In some embodiments, the channel material layer may be formed such that it is strained to the underlying Ge-based layer. Accordingly, as can be understood based on this disclosure, use of the Ge-based layer described herein can enable different semiconductor channel material to be formed thereon in a strained manner as compared to only using the Si substrate as the template from which the semiconductor channel material is formed. This is because the Ge-based layer has sufficiently high/device quality monocrystalline semiconductor material at and near its top surface due to the reduced defect/dislocation density at that location (as a result of employing the inverse grading described herein). Further, the Ge-based layer is at least partially relaxed, thereby providing a template or seeding layer surface with a different lattice constant than that of Si (which is 5.431 Å at 300 K). This is significant, because the channel material layer would relax if there is a big enough lattice delta between its material and the material on which it is grown (e.g., if the lattice delta reaches the point of being a lattice mismatch, which typically occurs around a lattice delta of 2-3%). Thus, by allowing the lattice constant of the template/seeding surface for that channel material layer to be adjusted, through use of the Ge-based layer as described herein, the techniques described herein enable the formation of a wider range of possible fully strained channel region materials for transistor devices, such as SiGe with relatively higher Ge concentrations (e.g., greater than 30, 35, or 40% Ge by atomic percentage), Si and various group III-V materials. In some embodiments, a given channel material layer may be strained to the underlying Ge-based layer such that the in-plane lattice parameters of the channel material layer are within 50, 45, 40, 35, 30, 25, 20, 15, 10, or 5%, or essentially the same as, the in-plane lattice parameter at/near the top surface of the Ge-based layer. Further, where a channel material layer is strained (to the underlying Ge-based layer), that strain may extend to essentially the top surface of the channel material layer, such that the channel material layer is strained throughout the layer and maintains the strain through subsequent IC processing to the end structure, in accordance with some embodiments.

In some embodiments, multiple different channel material layers may be formed on different areas of the Ge-based layer, such as for CMOS applications, for example. For instance, a first channel material layer may be formed on a first area of the Ge-based layer to be used for one or more p-channel transistor devices (e.g., one or more PMOS devices) and a second channel material may be formed on a second area of the Ge-based layer to be used for one or more n-channel transistor devices (e.g., one or more NMOS devices). As previously described, by selecting the Ge-based layer to have the desired material (e.g., the desired Ge concentration and/or alloying with Si, C, and/or Sn) and achieving a desired relaxation percentage, the Ge-based layer can provide a template/seeding layer from which to grow the multiple different channel material layers, such that a first channel material used for p-channel transistors may have a relatively higher lattice constant than the template surface to achieve compressive strain and a second channel material used for n-channel transistors may have a relatively lower lattice constant than the template surface to achieve tensile strain. By way of example, employing a Ge-based layer of $Si_{0.7}Ge_{0.3}$ enables the formation of fully-strained (with compressive strain) $Si_{0.4}Ge_{0.6}$ p-channel material on that $Si_{0.7}Ge_{0.3}$ layer, while also allowing for the formation of fully-strained (with tensile strain) Si n-channel material. In such an example, if the $Si_{0.4}Ge_{0.6}$ p-channel material were instead formed on the Si substrate, that $Si_{0.4}Ge_{0.6}$ p-channel material would relax (at least in part) due to the lattice mismatch between Si and $Si_{0.4}Ge_{0.6}$. Such relaxation caused by the lattice mismatch in the example case (where the techniques described herein are not employed) is undesirable, as it leads to a decrease in charge carrier mobility and thereby degrades the overall performance of the device. Further, if the Si n-channel material were instead formed on the Si substrate, the lattice parameters would be exactly matched, and thus, strain would not be produced in the first instance in that Si n-channel material.

In some embodiments, the techniques described herein can be used to benefit n-channel devices (e.g., NMOS) and/or p-channel devices (e.g., PMOS). Further, in some embodiments, the techniques described herein can be used to benefit MOSFET devices, tunnel FET (TFET) devices, Fermi filter FET (FFFET) devices, and/or any other suitable devices as will be apparent in light of this disclosure. Further still, in some embodiments, the techniques described herein can be used to form complementary transistor circuits (such as CMOS circuits), where the techniques can be used to benefit one or more of the included n-channel and p-channel transistors making up the CMOS circuit. Further yet, in some embodiments, the techniques described herein can be used to benefit a multitude of transistor configurations, such as planar and non-planar configurations, where the non-planar configurations may include finned or FinFET configurations (e.g., dual-gate or tri-gate), gate-all-around (GAA) configurations (e.g., nanowire or nanoribbon), or some combination thereof (e.g., beaded-fin configurations), to provide a few examples. In addition, in some embodiments, the techniques can be used for a variety of source/drain (S/D) configurations, such as replacement material S/D, cladded S/D, and/or any other suitable S/D configuration as will be apparent in light of this disclosure. The techniques described herein may be used to benefit logic transistor devices or transistor-based devices used for other suitable applications (e.g., amplification, switching, etc.). Therefore, the techniques described herein can be used to benefit a multitude of transistor devices. In general, the techniques allow transistors to be further scaled with diverse channel materials, while ensuring lower leakage, higher drive currents, and thereby improved performance.

Note that, as used herein, the expression "X includes at least one of A or B" refers to an X that may include, for example, just A only, just B only, or both A and B. To this end, an X that includes at least one of A or B is not to be understood as an X that requires each of A and B, unless expressly so stated. For instance, the expression "X includes A and B" refers to an X that expressly includes both A and B. Moreover, this is true for any number of items greater than two, where "at least one of" those items is included in X. For example, as used herein, the expression "X includes at least one of A, B, or C" refers to an X that may include just A only, just B only, just C only, only A and B (and not C), only A and C (and not B), only B and C (and not A), or each of A, B, and C. This is true even if any of A, B, or C happens to include multiple types or variations. To this end, an X that includes at least one of A, B, or C is not to be understood as an X that requires each of A, B, and C, unless expressly so stated. For instance, the expression "X includes A, B, and C" refers to an X that expressly includes each of A, B, and C. Likewise, the expression "X included in at least one of A or B" refers to an X that may be included, for example, in just A only, in just B only, or in both A and B. The above discussion with respect to "X includes at least one of A or B" equally applies here, as will be appreciated.

Use of the techniques and structures provided herein may be detectable using tools such as: electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate an integrated circuit (IC) including diverse transistor channel material enabled by a thin, inverse-graded, Ge-based layer. In some such embodiments, the inverse grading of the Ge-based layer is with respect to the Ge concentration within the layer. For instance, in some cases, the inverse grading may be achieved via a gradual gradient or via a step-wise approach (that may form a multilayer structure that includes distinct interfaces), where the Ge concentration is greatest near the substrate and decreases therefrom to a minimum Ge concentration farthest from the substrate. Regardless of how the inverse-graded Ge concentration is achieved, it can be identified via SIMS, TEM, EDX mapping, and/or atom probe tomography.

Further, in some such embodiments, the Ge-based layer may be characterized by the nucleation of defects (e.g., dislocations and stacking faults) at the substrate/Ge-based layer interface which predominantly terminate prior to reaching the top surface of the Ge-based layer, such that they do not run through to the overlying channel material layer, which may be identified through high resolution TEM imagining, for instance. Thus, at least the top portion of the thin (e.g., at most 500, 450, 400, 350, 300, 250, or 200 nm), inverse-graded (e.g., having a Ge concentration change that goes from a relatively high concentration, such as 100, 90, 80, 70, 60, 50, 40, 30, or 20% Ge to a relatively low concentration, such as 5, 10, 20, 30, 40, 50, 60, 70, or 80%), relaxed (e.g., having an actual lattice constant at the top surface that is within 50, 40, 30, 20, or 10% of its bulk material fully relaxed lattice constant), Ge-based (e.g., at least including germanium, while also including at least one of Si, C, and Sn) layer may include relatively less defects (e.g., a defect density of at most 1E9, 5E8, 1E8, 5E7, 1E7, 5E6, 1E6, 5E5, 1E5, 5E4, or 1E4 per square cm) than if the inverse grading of the Ge concentration in the Ge-based layer were not employed. In some embodiments, the techniques described herein may be detected based on the benefits derived from their use, which includes diverse channel materials (particularly diverse and fully strained channel materials), relatively lower leakage, relatively higher drive currents (e.g., as a result of the strain achievable in the channel region which increases channel mobility), and/or other improved device performance. Numerous configurations and variations will be apparent in light of this disclosure.

Architecture and Methodology

FIG. 1 illustrates method 100 of forming an integrated circuit (IC) including diverse transistor channel material enabled by a thin, inverse-graded, germanium (Ge)-based layer, in accordance with some embodiments of the present disclosure. FIGS. 2A-D and 3A-J illustrate example IC structures formed when carrying out method 100 of FIG. 1, in accordance with some embodiments of the present disclosure. Note that the techniques and structures described herein are primarily depicted and described in the context of forming finned or FinFET transistor configurations (e.g., tri-gate transistor configurations), for ease of illustration. However, in some embodiments, the techniques may be used to form transistors of any suitable geometry or configuration, as will be apparent in light of this disclosure. Also note that the techniques for forming the finned structures used in the channel region of one or more transistors may include blanket deposition techniques (e.g., using processes 102-110 to form structures 2A-D and 3E), replacement fin techniques (e.g., to form structures 3A-E), and/or any other suitable techniques as will be apparent in light of this disclosure. Further note that method 100 includes a primary path that illustrates a gate last transistor fabrication process flow (e.g., a replacement gate process flow), which is utilized in some embodiments. However, in other embodiments, a gate first process flow may be used, as will be described herein (and which is illustrated with the alternative gate first flow 100' indicator in FIG. 1). Numerous variations and configurations will be apparent in light of this disclosure.

A multitude of different transistor devices can benefit from the techniques described herein, which includes, but is not limited to, various field-effect transistors (FETs), such as metal-oxide-semiconductor FETs (MOSFETs), tunnel FETs (TFETs), and Fermi filter FETs (FFFETs) (also known as tunnel source MOSFETs), to name a few examples. For example, the techniques may be used to benefit an n-channel MOSFET (NMOS) device, which may include a source-channel-drain scheme of n-p-n or n-i-n, where 'n' indicates n-type doped semiconductor material, 'p' indicates p-type doped semiconductor material, and 'i' indicates intrinsic/undoped semiconductor material (which may also include nominally undoped semiconductor material, including dopant concentrations of less than 1E16 atoms per cubic centimeter (cm), for example), in accordance with some embodiments. In another example, the techniques may be used to benefit a p-channel MOSFET (PMOS) device, which may include a source-channel-drain scheme of p-n-p or p-i-p, in accordance with some embodiments. In yet another example, the techniques may be used to benefit a TFET device, which may include a source-channel-drain scheme of p-i-n or n-i-p, in accordance with some embodiments. In still another example, the techniques may be used to benefit a FFFET device, which may include a source-channel-drain scheme of np-i-p (or np-n-p) or pn-i-n (or pn-p-n), in accordance with some embodiments.

Figure 3A:
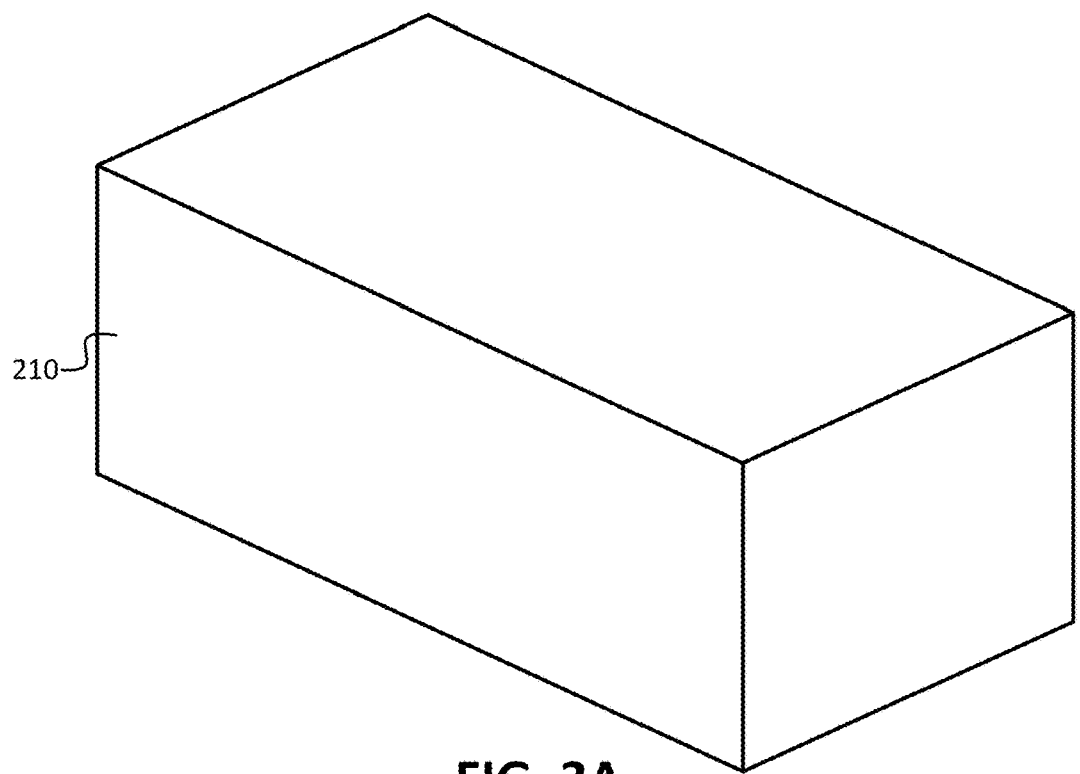
Figure 3B:
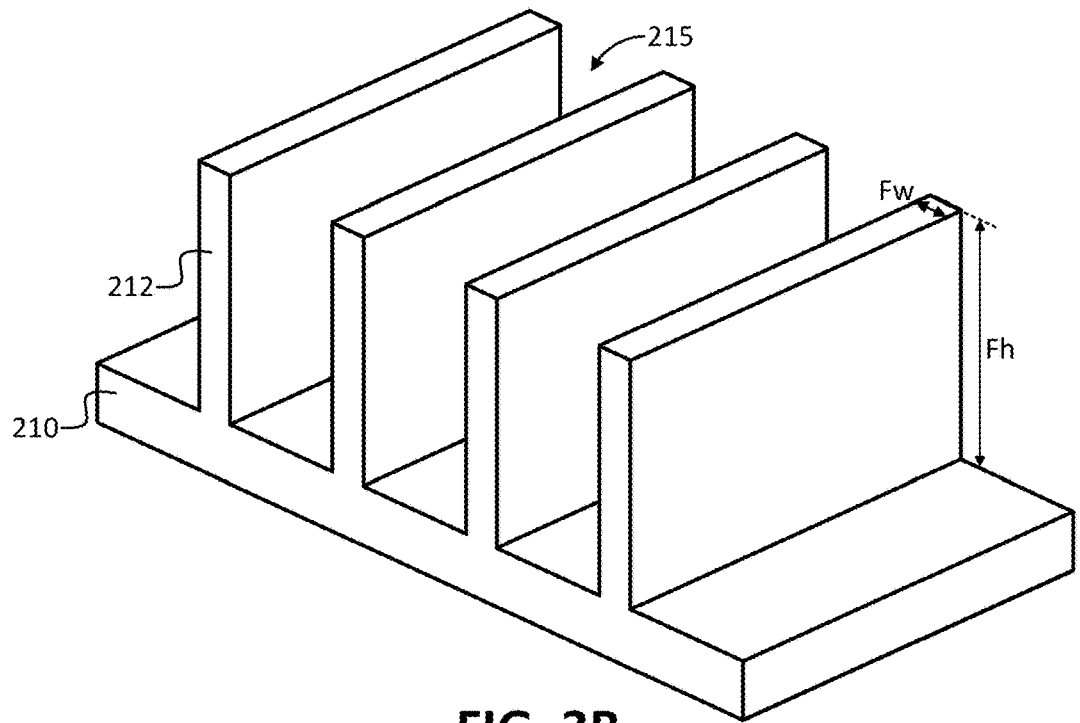
Figure 3C:
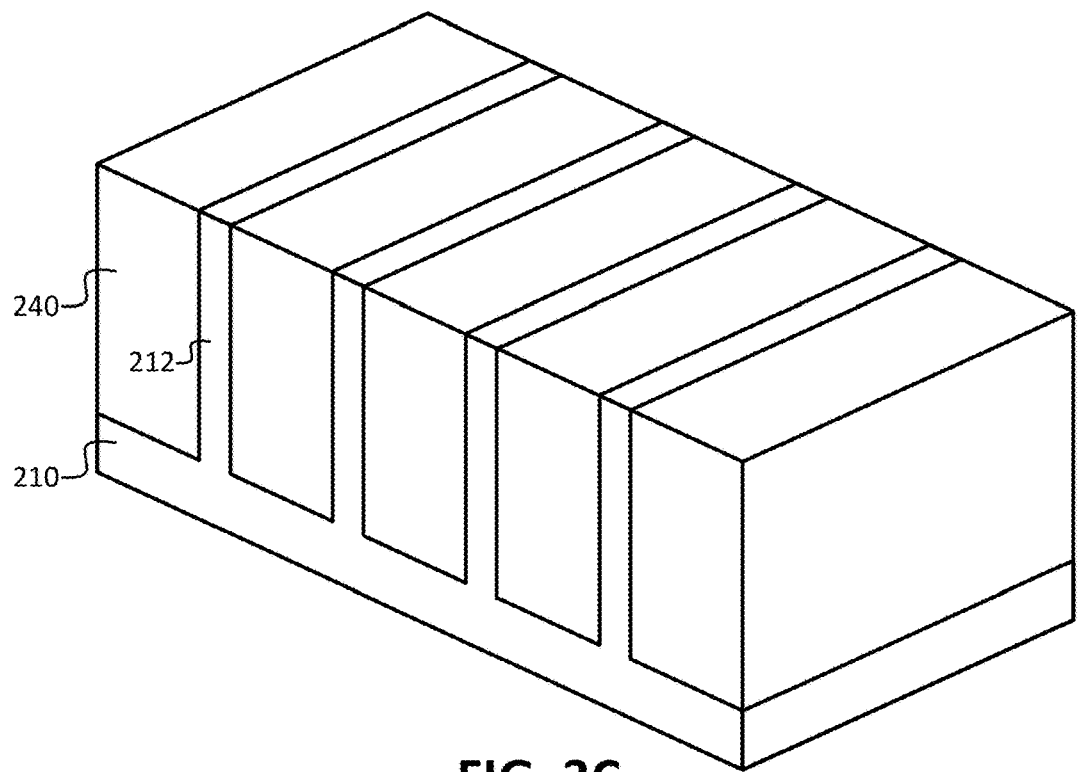
Figure 3D:
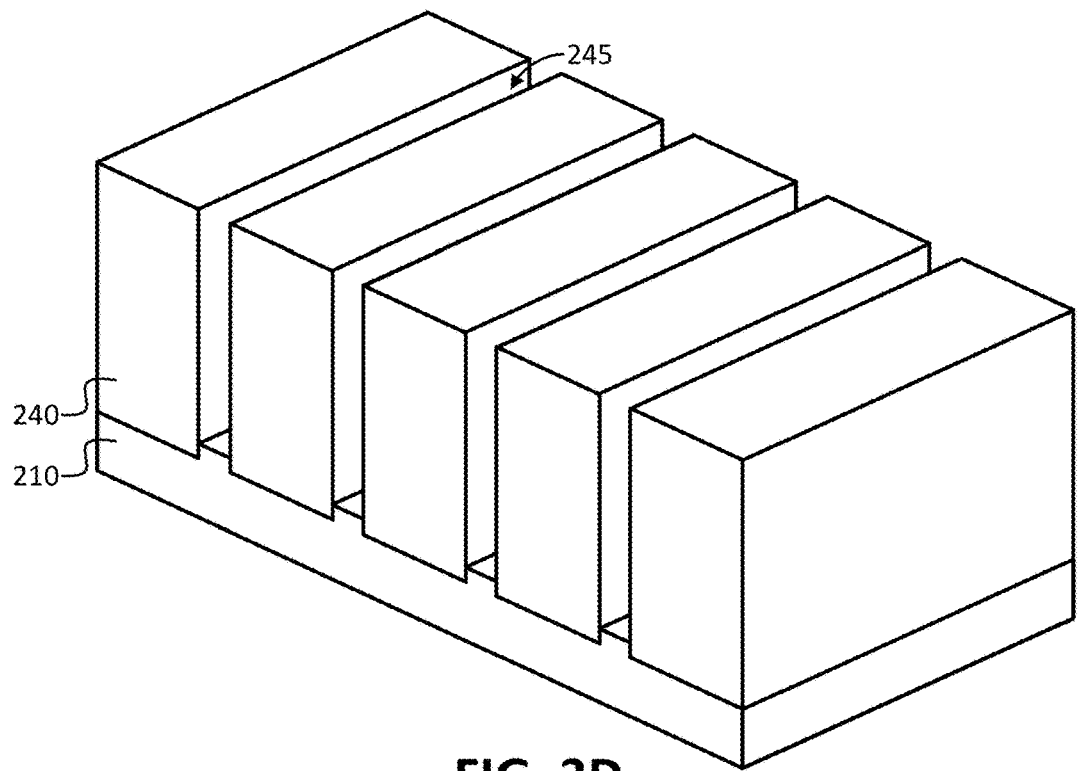

In addition, in some embodiments, the techniques may be used to benefit transistors including a multitude of configurations, such as planar and/or non-planar configurations, where the non-planar configurations may include finned or FinFET configurations (e.g., dual-gate or tri-gate), gate-all-around (GAA) configurations (e.g., nanowire or nanoribbon), or some combination thereof (e.g., a beaded-fin configurations), to provide a few examples. For instance, FIG. 3I illustrates an example IC structure including transistors having finned and nanowire configurations, as will be described in more detail below. Further, the techniques may be used to benefit complementary transistor circuits, such as complementary MOS (CMOS) circuits, where the techniques may be used to benefit one or more of the included n-channel and/or p-channel transistors making up the CMOS circuit. Other example transistor devices that can benefit from the techniques described herein include few to single electron quantum transistor devices, in accordance with some embodiments. Further still, any such devices may employ semiconductor materials that are three-dimensional crystals as well as two dimensional crystals or nanotubes, for example. In some embodiments, the techniques may be used to benefit devices of varying scales, such as IC devices having critical dimensions in the micrometer (micron) range and/or in the nanometer (nm) range (e.g., formed at the 22, 14, 10, 7, 5, or 3 nm process nodes, or beyond).

Figure 2A:
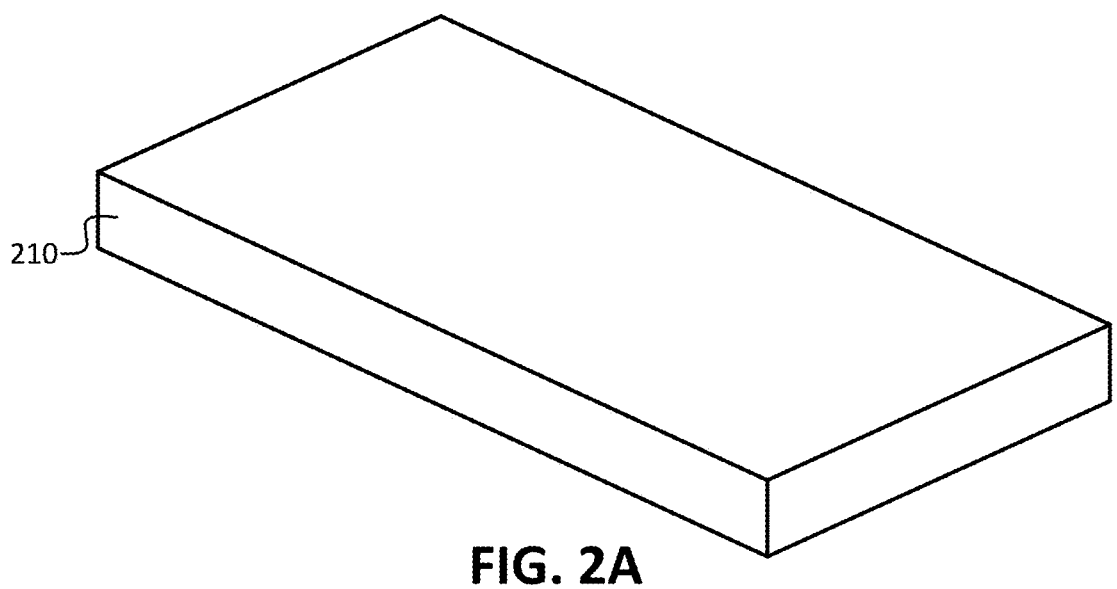

Method 100 of FIG. 1 includes providing 102 a Si substrate 210 as shown in the example of FIG. 2A, in accordance with some embodiments. Substrate 210, in some embodiments may include a bulk Si substrate (e.g., a bulk Si wafer), a Si on insulator (SOI) structure where an insulator/dielectric material (e.g., an oxide material, such as silicon dioxide) is sandwiched between two Si layers (e.g., in a buried oxide (BOX) structure), or any other suitable starting substrate where the top layer includes Si. In some embodiments, substrate 210 may be doped with any suitable n-type and/or p-type dopant at a dopant concentration in the range of 1E16 to 1E22 atoms per cubic cm, for example. For instance, the Si of substrate 210 may be p-type doped using a suitable acceptor (e.g., boron) or n-type doped using a suitable donor (e.g., phosphorous, arsenic) with a doping concentration of at least 1E16 atoms per cubic cm. However, in some embodiments, substrate 210 may be undoped/intrinsic or relatively minimally doped (such as including a dopant concentration of less than 1E16 atoms per cubic cm), for example. In general, although substrate 210 is referred to herein as a Si substrate, in some embodiments, it may essentially consist of Si, while in other embodiments, the substrate may primarily include Si but may also include other material (e.g., dopant at a given concentration). Also note that the substrate 210 may include relatively high quality or device quality monocrystalline Si that provides a suitable template/seeding surface from which other monocrystalline semiconductor material features and layers can be formed. Therefore, unless otherwise explicitly stated, a Si substrate as described herein is not intended to be limited to a substrate that only includes Si.

In some embodiments, substrate 210 may include a surface crystalline orientation described by a Miller index of (100), (110), or (111), or its equivalents, as will be apparent in light of this disclosure. Although substrate 210, in this example embodiment, is shown as having a thickness (dimension in the Y-axis direction) similar to other layers in the figures for ease of illustration, in some instances, substrate 210 may be relatively much thicker than the other layers, such as having a thickness in the range of 1 to 950 microns (or in the sub-range of 20 to 800 microns), for example, or any other suitable thickness value or range as will be apparent in light of this disclosure. In some embodiments, substrate 210 may include a multilayer structure including two or more distinct layers (that may or may not be compositionally different). In some embodiments, substrate 210 may include grading (e.g., increasing and/or decreasing) of one or more material concentrations throughout at least a portion of the substrate 210. In some embodiments, substrate 210 may be used for one or more other IC devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various radio frequency (RF) devices, various sensors, or any other suitable semiconductor or IC devices, depending on the end use or target application. Accordingly, in some embodiments, the structures described herein may be included in a system-on-chip (SoC) application, as will be apparent in light of this disclosure.

Figure 2B:
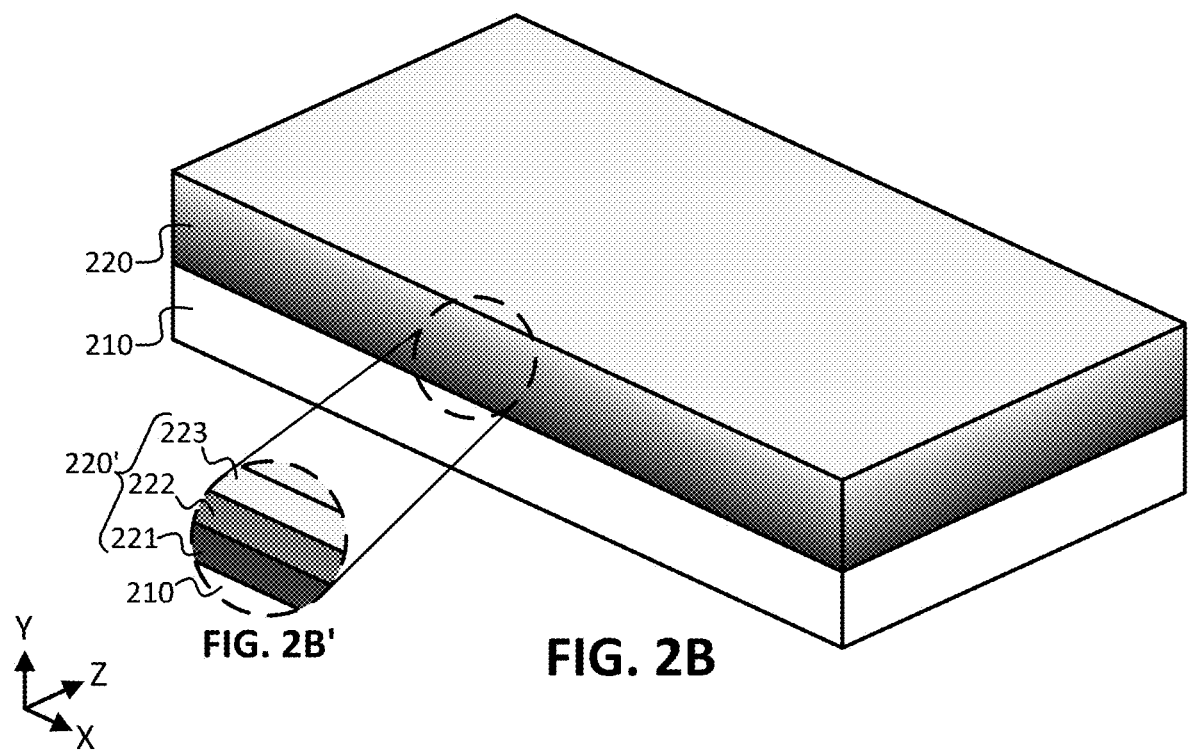

Method 100 of FIG. 1 continues with forming 104 a thin, inverse-graded, Ge-based layer 220 (referred to simply as a Ge-based layer) on the Si substrate of FIG. 2A to form the example resulting structure of FIG. 2B, in accordance with some embodiments. In some embodiments, the Ge-based layer 220 may be formed using any suitable processing, such as via chemical vapor deposition (CVD), physical vapor deposition (PVD), atomic layer deposition (ALD), vapor-phase epitaxy (VPE), molecular-beam epitaxy (MBE), liquid-phase epitaxy (LPE), spin-on processing, and/or any other suitable technique as can be understood based on this disclosure. The Ge-based layer 220, in some embodiments, may include SiGe or Ge that may or may not be alloyed with tin (Sn) and/or carbon (C). In other words, in some such embodiments, Ge-based layer 220 is a monocrystalline group IV semiconductor material that at least includes germanium. In some embodiments, Ge-based layer 220 includes silicon and germanium that may or may not be alloyed with tin and/or carbon. Ge-based layer 220 is referred to herein as such because it at least includes germanium in at least a portion of the layer 220, and in some cases, throughout the entirety of the layer 220. For instance, in some embodiments, Ge-based layer 220 may include monocrystalline Ge or SiGe at the bottom (near the Si substrate), and then transition to SiGe with a relatively lower Ge concentration at the top (near the overlying channel material layer).

In some embodiments, the Ge-based layer 220 includes inverse-graded Ge concentrations, such that it includes a relatively higher Ge concentration in a bottom portion (near substrate 210) and a relatively lower Ge concentration in a top portion (away from substrate 210 and near subsequently formed channel material layer 230), where there may or may not be one or more intermediate portions with varying Ge concentrations between the bottom and top portions. For instance, the inverse-graded nature of Ge-based layer 220 is illustrated in FIG. 2B, where the darker shading of the layer indicates relatively higher Ge concentration and the lighter shading of the layer indicates relatively lower Ge concentration. In some embodiments, the Ge concentration of the Ge-based layer 220 may be decreased or inverse-graded with a smooth gradient of the Ge concentration throughout the layer. For instance, in some such embodiments, the Ge concentration may be decreased as the Ge-based layer 220 is being deposited (e.g., via in-situ processing), while the concentration of one or more other elements (e.g., Si, C, and/or Sn) may be increased as the Ge-based layer 220 is deposited.

In other embodiments, the Ge concentration of the Ge-based layer 220 may be decreased or inverse-graded using a step-wise approach, where the Ge concentration is abruptly changed (e.g., with at least a 5% difference in Ge concentration) throughout the Ge-based layer 220. Such abrupt changes may happen in a layer-by-layer manner, such that the Ge-based layer 220 includes a multilayer structure of progressively decreasing Ge concentration. For instance, FIG. 2B' illustrates a blown-out portion of FIG. 2B showing a multilayer Ge-based layer 220' formed with a step-wise approach, in accordance with some embodiments. As shown in FIG. 2B' the multilayer Ge-based layer 220' includes three sub-layers, 221, 222, and 223, where the Ge concentration is relatively highest in layer 221, relatively lowest in layer 223, and at an intermediate concentration in layer 222 (which is indicated by the shading of the layers). Note that sub-layers 221, 222, and 223 are all shown as having the same thickness (dimension in the Y-axis direction), the present disclosure is not intended to be so limited, as they may have varying thicknesses, for example. In still other embodiments, a hybrid approach may be utilized, such as where a step-wise approach is used, but the Ge-concentration is also smoothly graded in at least one sub-layer.

In some embodiments, the decrease in Ge concentration of the Ge-based layer, from the starting relatively high Ge concentration at the bottom (closest to the Si substrate 210) to the ending relatively low Ge concentration at the top (farthest from the Si substrate 210), may be in the range of 5-95%, may be approximately 5, 10, 15, 20, 25, 30, 35, 40, 45, 50, 55, 60, 65, 70, 75, 80, 85, 90, or 95%, and/or may be at least 5, 10, 15, 20, 25, 30, 35, 40, 45, 50, 55, 60, 65, 70, 75, 80, 85, 90, or 95%, for example. In the extreme example of the aforementioned range, the Ge-based layer 220 would start as Ge and transition to $Si_{0.95}Ge_{0.05}$, for instance. To provide another example, the Ge-based layer 220 may be linearly graded from $Si_{0.4}Ge_{0.6}$ (60% Ge concentration) at the substrate 210 to $Si_{0.8}Ge_{0.2}$ (20% Ge concentration) at the channel material layer 230 end, which would be a 40% decrease in Ge concentration, as can be understood. In such an example case, a $Si_{0.6}Ge_{0.4}$ channel material layer may be formed on the $Si_{0.8}Ge_{0.2}$ top seeding surface of the Ge-based layer 220. In embodiments where the Ge-concentration includes an inverse-graded Ge concentration based on a smooth gradient (e.g., where no distinct interfaces may not be present), the smooth gradient need not be consistent throughout the layer. For instance, in some such embodiments, the Ge concentration used when depositing the Ge-based layer 220 may be first decreased at a first rate and then subsequently decreased at a second, different rate (e.g., fast decrease in Ge concentration at first followed by a slow decrease or slow decrease in Ge concentration at first followed by a fast decrease, and so forth).

In embodiments where the Ge-based layer 220 includes an inverse-graded Ge concentration based on a step-wise approach (e.g., where distinct interfaces may be present), there may be 1, 2, 3, 4, 5, 6, 7, 8, 9 or more steps in the multilayer structure of the Ge-based layer 220, for example. Further, in embodiments where the Ge-based layer 220 includes an inverse-graded Ge concentration based on a step-wise approach, the Ge-based layer 220 may include a multilayer structure including 2, 3, 4, 5, 6, 7, 8, 9, 10 or more sub-layers, for example. For instance, if a two-step approach is applied (such that the multilayer structure includes three sub-layers), then the Ge-based layer 220 may start with a first sub-layer of $Si_{0.4}Ge_{0.6}$ at the substrate, followed by a second sub-layer of $Si_{0.6}Ge_{0.4}$ formed on the first sub-layer, followed by a third sub-layer of $Si_{0.8}Ge_{0.2}$ formed on the second sub-layer, where that third sub-layer of the Ge-based layer 220 provides a seeding surface of $Si_{0.8}Ge_{0.2}$ from which to form one or more channel material layers. Thus, the inverse-graded nature of the Ge-based layer 220 variously described herein can be in any form, as long as there is an overall decrease in the Ge concentration going away from the substrate (which may equate to an overall increase in Si concentration going away from the substrate, in some embodiments).

In some embodiments, the Ge-based layer 220 may or may not be doped with any suitable dopant (e.g., boron, phosphorous, and/or arsenic). In embodiments where the Ge-based layer 220 is doped, it may be n-type doped (e.g., with phosphorous or arsenic) or p-type doped (e.g., with boron) at a dopant concentration in the range of 1E16 to 1E22 atoms per cubic cm, for example. In some embodiments, Ge-based layer 220 may include a multilayer structure including two or more distinct layers (that may or may not be compositionally different). For instance, in embodiments where the Ge concentration in the Ge-based layer 220 is inversely graded using a step-wise or incremental manner, the Ge-based layer 220 may include a multilayer structure. In some embodiments, the Ge-based layer 220 may include a vertical thickness (dimension in the Y-axis direction) in the range of 20-500 nm (or in a subrange of 20-50, 20-100, 20-200, 20-300, 20-400, 50-100, 50-200, 50-300, 50-400, 50-500, 100-250, 100-400, 100-500, 200-400, or 200-500 nm) and/or a maximum vertical thickness of at most 500, 450, 400, 350, 300, 250, 200, 150, 100, or 50 nm, for example. Other suitable materials and thickness values/ranges/thresholds will be apparent in light of this disclosure. Also note that in general, the inverse grading described herein for Ge-based layer 220 is with respect to the Y-axis direction or within a suitable plus/minus (e.g., within 15 degrees) of Y-axis. In other words, the inverse grading is generally with respect to the vertical thickness of the Ge-based layer 220, for example.

By forming the Ge-based layer 220 with inverse grading of the Ge concentration, the Ge-based layer 220 can relax, at least in part, depending on the particular configuration. For instance, in some embodiments, the top surface or portion (e.g., top 1, 2, 3, 4, 5, 10, 15, 20, or 25%) of the Ge-based layer 220 may relax to within 50, 45, 40, 35, 30, 25, 20, 15, 10, or 5% of the bulk lattice parameters of the material of that top surface or portion of the Ge-based layer 220, for example. By way of example, if the top surface of the Ge-based layer 220 includes SiGe having a concentration of 30% Ge, which has a lattice constant of approximately 5.499 Å at 300 K, and it is formed on a Si substrate with a relaxation value to within 20% of its bulk lattice parameters, then that $Si_{0.7}Ge_{0.3}$ top surface of the Ge-based layer 220 would have a lattice constant of approximately 5.485-5.499 Å at 300 K. Note that the top surface or portion of the Ge-based layer 220 is the relevant surface/portion of concern for the techniques disclosed herein, because it is used as the template/seeding feature from which the channel material layer is formed. Therefore, by shifting the template/seeding surface lattice constant from which the channel material layer is formed (as opposed to the sole lattice constant of Si, which is 5.431 Å at 300 K), the techniques described herein enable a more diverse range of monocrystalline semiconductor material for transistor channels, and also allow such diverse material channel regions to maintain strain throughout the entirety of those channel regions, through material engineering.

In some embodiments, the lattice parameter of the bottom-most portion of the Ge-based layer 220 (nearest to the Si substrate 210) may be relatively higher than the lattice parameter of the top-most portion of the Ge-based layer 220 (farthest from the Si substrate 210 and closest to the channel material layer 230). In some such embodiments, the lattice parameter of the bottom-most portion of the Ge-based layer (which may include the highest Ge concentration in the Ge-based layer 22) may be at least 0.01, 0.02, 0.03, 0.04, 0.05, 0.06, 0.07, 0.08, 0.09, 0.10, 0.11, 0.12, 0.13, 0.14, 0.15, 0.16, 0.17, 0.18, 0.19, 0.2, 0.21, or 0.22 Å at 300 K greater than the lattice parameter of the top-most portion of the Ge-based layer (which may include the lowest Ge concentration in the Ge-based layer 220), or some other suitable threshold value as will be apparent in light of this disclosure. Numerous different ways of characterizing the inverse grading of the Ge-based layer 220 will be apparent in light of this disclosure.

In some embodiments, the Ge-based layer 220 causes the formation of defects (e.g., dislocations and/or stacking faults) that nucleate at the substrate 210/Ge-based layer 220 interface and are predominantly contained within the Ge-based layer 220 rather than running through to the overlying channel material layer 230. In other words, the majority of the defects do not reach the top surface of the Ge-based layer 220 due to the inversely-graded nature of the Ge-based layer 220. Thus, regardless of how the inverse-graded Ge-based layer 220 is formed (e.g., with a smooth gradient or in a step-wise manner), it can be characterized by the nucleation of defects (e.g., dislocations and/or stacking faults) which nucleate at the substrate/Ge-based layer interface and predominantly terminate prior to reaching the top portion/surface of the Ge-based layer 220. Therefore, the inverse-graded nature of the Ge-based layer 220 (e.g., where the portion of the Ge-based layer nearest the Si substrate 210 includes the highest Ge-concentration of that layer) releases the energy required to form such defects in the first instance, and thus, the Ge-based layer 220 may be considered a high entropy layer. Without the inverse-graded nature of the Ge-based layer 220, forming a thin Ge-based layer (e.g., with a thickness of less than 500 nm) on a Si substrate (such as substrate 210) would result in relatively more defects propagating to the top surface of the thin Ge-based layer, which is undesirable as previously described.

In some embodiments, the top portion/surface of the Ge-based layer 220 may have a relatively low defect or dislocation density, such as less than 1E9 per square cm, which is the typical minimum threshold defect/dislocation density that would form at the top portion/surface of the thin Ge-based layer if the inverse-graded Ge concentration scheme as described herein were not employed. In some such embodiments, the top portion/surface of the Ge-based layer 220 may have a defect/dislocation density of at most 1E9, 5E8, 1E8, 5E7, 1E7, 5E6, 1E6, 5E5, 1E5, 5E4, or 1E4 per square cm, for example. In some embodiments, the top portion/surface of the Ge-based layer 220 may include essentially no defects or dislocations, as they may terminate prior to reaching that top portion/surface. Note that when the top portion/surface or surface/portion of the Ge-based layer 220 is referred to herein, such description may pertain to the top-most surface of the Ge-based layer 220 (e.g., the surface farthest from the Si substrate and closest to the channel material layer) and/or the top portion of the Ge-based layer (e.g., the top 1, 2, 3, 4, 5, 10, 15, or 20% of the Ge-based layer). Thus, reference to the top portion/surface or top surface/portion of the Ge-based layer 220 may mean only the top surface of the Ge-based layer 220, only the top portion of the Ge-based layer 220, or both the top surface and the top portion of the Ge-based layer 220. Also note that in some cases, the defect/dislocation density may include the threading dislocation density. Accordingly, in some embodiments, the interface between the Ge-based layer 220 and the top surface of the Si substrate 210 may become less distinct or essentially merge together (e.g., as a result of the defects formed at that interface).

In some embodiments, the Ge-based layer 220 may be included, in part, in the channel region of one or more transistor devices. In other embodiments, the Ge-based layer 220 may be completely below the channel region of a given transistor, where it is completely contained in a sub-channel or sub-fin region, for example. In some such embodiments, the Ge-based layer 220 can be used as a template or a seeding layer from which to form various different channel material layers, as will be described in more detail below. Further, in some such embodiments, the Ge-based layer 220 may be oppositely type doped relative to the overlying channel material layer 230 to provide a tunnel diode configuration to help reduce or eliminate parasitic leakage (e.g., subthreshold leakage). For instance, in some embodiments, the Ge-based layer 220 may be intentionally p-type doped (e.g., with a doping concentration of at least 1E16, 5E16, 1E17, 5E17, 1E18, 5E18, or 1E19 atoms per cubic cm) if the overlying channel material layer 230 is to be n-type doped, or vice versa, where the Ge-based layer 220 may be intentionally n-type doped (e.g., with a doping concentration of at least 1E16, 5E16, 1E17, 5E17, 1E18, 5E18, or 1E19 atoms per cubic cm) if the overlying channel material layer 230 is to be p-type doped.

Method 100 of FIG. 1 continues with forming 106 channel material layer 230 on Ge-based layer 220 to thereby form the example resulting structure of FIG. 2C, in accordance with some embodiments. In some embodiments, channel material layer 230 may be formed 106 using any suitable processes, such as one of the aforementioned techniques (e.g., CVD, PVD, ALD, VPE, MBE, LPE) and/or any other suitable processing. In some embodiments, channel material layer 230 may include any suitable semiconductor material, such as monocrystalline group IV and/or group III-V semiconductor material, for example. Recall that the use of "group IV semiconductor material" (or "group IV material" or generally, "IV") herein includes at least one group IV element (e.g., silicon, germanium, carbon, tin), such as silicon (Si), germanium (Ge), silicon germanium (SiGe), and so forth. Also recall that the use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), and so forth. Note that group III may also be known as the boron group or IUPAC group 13, group IV may also be known as the carbon group or IUPAC group 14, and group V may also be known as the nitrogen family or IUPAC group 15, for example.

In some embodiments, channel material layer 230, may include at least one of silicon, germanium, gallium, arsenide, indium, and aluminum. In some embodiments, the channel material layer 230 may be doped (e.g., with any suitable n-type or p-type dopant) at a dopant concentration in the range of 1E16 to 1E22 atoms per cubic cm, for example. For example, in the case of group IV semiconductor materials, the group IV material may be p-type doped using a suitable acceptor (e.g., boron) or n-type doped using a suitable donor (e.g., phosphorous, arsenic). In another example, in the case of group III-V semiconductor material, the group III-V material may be p-type doped using a suitable acceptor (e.g., beryllium, zinc) or n-type doped using a suitable donor (e.g., silicon). In other embodiments, the channel material layer may be intrinsic/undoped (or nominally undoped, with a dopant concentration less than 1E16 atoms per cubic cm), depending on the particular configuration. Further, in some embodiments, a sacrificial channel material layer may be formed at this stage of the processing, where the sacrificial channel material layer may be later removed and replaced with final channel material layer. Such a sacrificial channel material layer may be employed in embodiments where multiple channel material layers are formed, for example. Note that although layer 230 is referred to herein as a channel material layer, transistor channel regions formed using the techniques disclosed herein may also include Ge-based layer 220 and/or other layers as can be understood based on this disclosure.

In some embodiments, channel material layer 230 may include a multilayer structure that includes two or more distinct layers (that may or may not be compositionally different). In some such embodiments, the channel material layer may be formed using a layer-by-layer epitaxial growth approach (e.g., using an MBE process), such that the channel material layer may or may not appear to have distinct interfaces within the layer, depending on the particular configuration and observation level. In embodiments where a nanowire (or nanoribbon or GAA) transistor is to be formed from the channel material layer, it may include at least one channel layer and at least one sacrificial layer to be removed to release the channel layer to enable forming that nanowire transistor, as will be described in more detail herein (e.g., with respect to FIG. 3I). For instance, in an example embodiment, a given channel material layer may include alternating layers of group IV and group III-V semiconductor material, where either the group IV or group III-V material is sacrificial, to enable the formation of one or more nanowires (e.g., where the sacrificial material is subsequently removed, such as during replacement gate processing). In some embodiments, channel material layer 230 may include grading (e.g., increasing and/or decreasing) of the concentration of one or more materials within the feature, such as the grading of a semiconductor material component concentration and/or the grading of the dopant concentration, for example. For instance, the grading may occur as the material of layer 230 is epitaxially grown (e.g., in the Y-axis direction). In some embodiments, a given channel material layer 230 may include a vertical thickness (dimension in the Y-axis direction) in the range of 20-500 nm (or in a subrange of 20-50, 20-100, 20-200, 20-300, 20-400, 50-100, 50-200, 50-300, 50-400, 50-500, 100-250, 100-400, 100-500, 200-400, or 200-500 nm) and/or a maximum vertical thickness of at most 500, 450, 400, 350, 300, 250, 200, 150, 100, or 50 nm, for example. Other suitable materials and thickness values/ranges/thresholds will be apparent in light of this disclosure.

In some embodiments, multiple different channel material layers may be formed on different areas of the Ge-based layer 220, such as for CMOS applications, for example. For instance, a first channel material layer may be formed on a first area of the Ge-based layer 220 to be used for one or more p-channel transistor devices (e.g., one or more PMOS devices) and a second channel material may be formed on a second area of the Ge-based layer 220 to be used for one or more n-channel transistor devices (e.g., one or more NMOS devices). By selecting the Ge-based layer 220 to have the desired material (e.g., the desired Ge concentration and alloying with Si, C, and/or Sn for the top surface of the Ge-based layer 220) and achieving a desired relaxation percentage, the Ge-based layer 220 can provide a template/seeding layer from which to grow the multiple different channel material layers, such that a first channel material used for p-channel transistors may have a relatively higher lattice constant or parameter value than the template surface to achieve compressive strain and a second channel material used for n-channel transistors may have a relatively lower lattice constant or parameter value than the template surface to achieve tensile strain. For instance, in some such embodiments, the first channel material layer may include SiGe or Ge such that the Ge-based layer 220 has at least 5, 10, 15, 20, 25, 30, 35, or 40% less Ge concentration by atomic percentage relative to the first channel material layer. Further, in some such embodiments, the second channel material layer may include SiGe or Si such that the Ge-based layer 220 has at least 5, 10, 15, 20, 25, 30, 35, or 40% more Ge concentration by atomic percentage relative to the second channel material layer.

In general, the top surface of Ge-based layer 220 and a given channel material layer 230 may have a difference in Ge concentration by atomic percentage in the range of 0-100%. In some embodiments employing multiple different channel material layers, the first channel material layer may include group IV semiconductor material (e.g., Si, SiGe, Ge, etc.) and the second channel material layer may include group III-V semiconductor material (e.g., GaAs, InGaAs, InP, etc.). Recall that, in general, a given channel material layer may include monocrystalline group IV semiconductor material and/or group III-V semiconductor material. For instance, in a beaded-fin transistor configuration, the channel region may include both group IV semiconductor material (e.g., for the broader or narrower portions) and group III-V semiconductor material (e.g., for the other of the broader or narrower portions). Note that the multiple different channel material layers may be formed using any suitable techniques, such as masking, depositing, and removing the masking as desired to form any number of compositionally different channel material layers. Further note that formation of multiple different channel material layers may include 2-5 or more compositionally different layers formed on the Ge-based layer 220, in accordance with some embodiments. In some embodiments, a given channel material layer 230 may be strained to the underlying Ge-based layer 220 such that the in-plane lattice parameters of the channel material layer are within 50, 45, 40, 35, 30, 25, 20, 15, 10, or 5%, or essentially the same as, the in-plane lattice parameter at/near the top surface of the Ge-based layer 220. Further, the strain may extend to essentially the top surface of the channel material layer 230, such that the channel material layer 230 is fully strained, in accordance with some embodiments. However, in other embodiments, a given channel material layer 230 may be essentially relaxed or at least relaxed in part (e.g., to within 50% of its material lattice constant). Where employed, numerous different channel material layer configurations and variations will be apparent in light of this disclosure.

Method 100 of FIG. 1 continues with patterning 108 the channel region material into fins to form the example resulting structure of FIG. 2D, in accordance with some embodiments. In some embodiments, patterning 108 may be performed using any suitable techniques, such as including one or more masking, patterning, lithography, and/or etching (e.g., wet and/or dry etching) processes, as can be understood based on this disclosure. For instance, the regions of the structure of FIG. 2C to be formed into fins may be masked off, followed by etch processing to form trenches 235 between each of the fin-shaped structures of FIG. 2D, for example. Note that the depth of the etch processing used to form the fins may vary and that such etch processing may be referred to as a shallow trench recess (STR) etch. For instance, as shown in FIG. 2D, the etch processing resulted in trenches 235 extending all the way down into substrate 210, such that each fin includes a stack, from bottom to top (in the Y-axis direction) of Si substrate 210 material, Ge-based layer 220 material, and channel material layer 230 material, in this example embodiment. However, in other embodiments, the etch processing may go farther down (e.g., such that trenches 235 may extend deeper into substrate 210) or the etch processing may not extend as far down as it did in FIG. 2D. For example, FIG. 2D' illustrates a blown-out portion of FIG. 2D showing an alternative patterning process where the etch processing stops before reaching the substrate 210/Ge-based layer 220 interface, in accordance with some embodiments. Therefore, numerous different etch levels may be used, as will be apparent in light of this disclosure.

Note that although each of the multilayer fin-shaped structures in FIG. 2D (of which there are four shown) are shown as having the same sizes and shapes relative to one another in this example structure for ease of illustration, the present disclosure is not intended to be so limited. For example, in some embodiments, the fin-shaped structures may be formed to have varying heights Fh and/or varying widths Fw that may correspond with (or be the same as) the final desired fin heights (AFh) and fin widths (Fw) described in more detail below. For instance, in some embodiments, a given Fw (dimension in the X-axis direction) may be in the range of 2-400 nm (or in a subrange of 2-10, 2-20, 2-50, 2-100, 2-200, 4-10, 4-20, 4-50, 4-100, 4-200, 4-400, 10-20, 10-50, 10-100, 10-200, 10-400, 50-100, 50-200, 50-400, or 100-400 nm), for example, or any other suitable value or range as will be apparent in light of this disclosure. Further, in some embodiments, a given Fh (dimension in the Y-axis direction) may be in the range of 4-800 nm (or in a subrange of 4-10, 4-20, 4-50, 4-100, 4-200, 4-400, 10-20, 10-50, 10-100, 10-200, 10-400, 10-800, 50-100, 50-200, 50-400, 50-800, 100-400, 100-800, or 400-800 nm), for example, or any other suitable value or range as will be apparent in light of this disclosure. In some embodiments, the fin heights Fh may be at least 25, 50, 75, 100, 125, 150, 175, 200, 300, 400, 500, 600, 700, or 800 nm tall, or greater than any other suitable threshold height as will be apparent in light of this disclosure. In some embodiments, the height to width ratio of the fins (Fh:Fw) may be greater than 1, such as greater than 1.5, 2, 2.5, 3, 3.5, 4, 4.5, 5, 6, 7, 8, 9, or 10, or greater than any other suitable threshold ratio, as will be apparent in light of this disclosure.

As previously stated, although the fins in FIG. 2D are shown as having the same heights Fh and widths Fw, the fins may be formed to have varying heights Fh, varying widths Fw, varying vertical starting points (location in the Y-axis direction), varying shapes, and/or any other suitable variation(s) as will be apparent in light of this disclosure. Moreover, trenches 235 may be formed to have varying depths, varying widths, varying vertical starting points (location in the Y-axis direction), varying shapes, and/or any other suitable variation(s) as will be apparent in light of this disclosure. Note that although four fins are shown in the example structure of FIG. 2D for ease of illustration, any number of fins may be formed, such as one, two, three, five, ten, hundreds, thousands, millions, and so forth, as can be understood based on this disclosure. Also note that the fins are shown in FIG. 2D as having a height that is relatively greater than the thickness (dimension in the Y-axis direction)

of the remainder of substrate 210, for ease of illustration. However, in some embodiments, the height of the fins (shown as Fh) may be relatively much less (e.g., at least 2-10 times less) than the thickness of the remainder of substrate 210, for example.

Figure 3E:
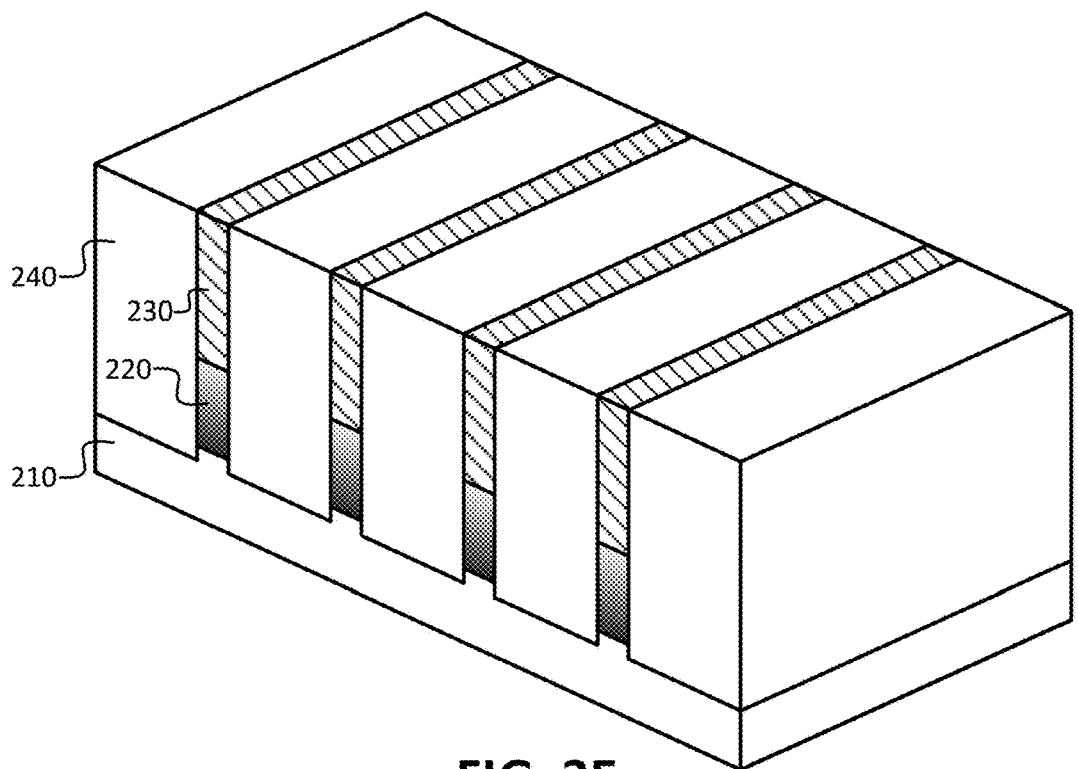

Method 100 of FIG. 1 continues with filling 110 trenches 235 between the fins of the structure of FIG. 2D with shallow trench isolation (STI) material 240, thereby forming the example resulting structure of FIG. 3E, in accordance with some embodiments. Such processing can include depositing the STI material and then optionally planarizing/polishing the structure (e.g., via CMP) to form the example structure of FIG. 3E, for example. In some embodiments, deposition of the STI material 240 may include any suitable deposition techniques, such as those described herein (e.g., CVD, ALD, PVD), or any other suitable deposition process. In some embodiments, STI material 240 (which may be referred to as an STI layer or STI regions) may include any suitable electrical insulator material, such as one or more dielectric, oxide (e.g., silicon dioxide), and/or nitride (e.g., silicon nitride) materials. In some embodiments, the material of STI layer 240 may be selected based on the material of substrate 210. For instance, the STI material may be selected from silicon dioxide or silicon nitride based on the use of a Si substrate 210, to provide some examples.

Method 100 of FIG. 1 may include an alternative replacement fin-based approach 111 for processes 102-110 to arrive at the structure of FIG. 3E, in accordance with some embodiments. For instance, FIGS. 3A-E illustrate example structures formed when carrying out the alternative replacement fin-based approach 111. Note that the previous relevant description with respect to processes 102-110 and the structures 2A-D and 3E formed therefrom is equally applicable to the alternative replacement fin-based process 111 and the structures of FIGS. 3A-E. As can be understood based on this disclosure, the replacement fin-based approach includes forming fins from the substrate, forming STI material around those fins, recessing the native-to-substrate fins to form fin-shaped trenches, and then forming replacement fins in the fin-shaped trenches. Such a replacement fin-based approach 111 to forming the structure of FIG. 3A can include providing a substrate 210 as shown in FIG. 3A. The previous relevant description with respect to substrate 210 is equally applicable here.

Replacement fin-based approach 111 continues with forming fins 212 from substrate 210 to form the example resulting structure of FIG. 3B. The previous relevant description with respect to the fins of FIG. 2D are equally applicable here, except that the fins 212 in FIG. 3B only include material native to substrate 210. Further, the previous relevant description with respect to trenches 235 is equally applicable to the trenches 215 between fins 212. Approach 111 continues with forming STI material 240 between the fins 212 to form the example resulting structure of FIG. 3C. The previous relevant description with respect to STI material 240 is equally applicable here. Approach 111 continues with recessing fins 212 to form fin-shaped trenches 245 in the example resulting structure of FIG. 3D. The recessing can be performed using any suitable techniques, such as wet and/or dry etch processing. Approach 111 continues with forming layers 220 and 230 (e.g., via deposition/epitaxial growth techniques) in trenches 245 to arrive at the example resulting structure of FIG. 3E. The previous relevant description with respect to layers 220 and 230 is equally applicable here, except that the layers are formed using a replacement fin-based approach 111 in this example embodiment as compared to the previously described blanket deposition approach.

Figure 3F:
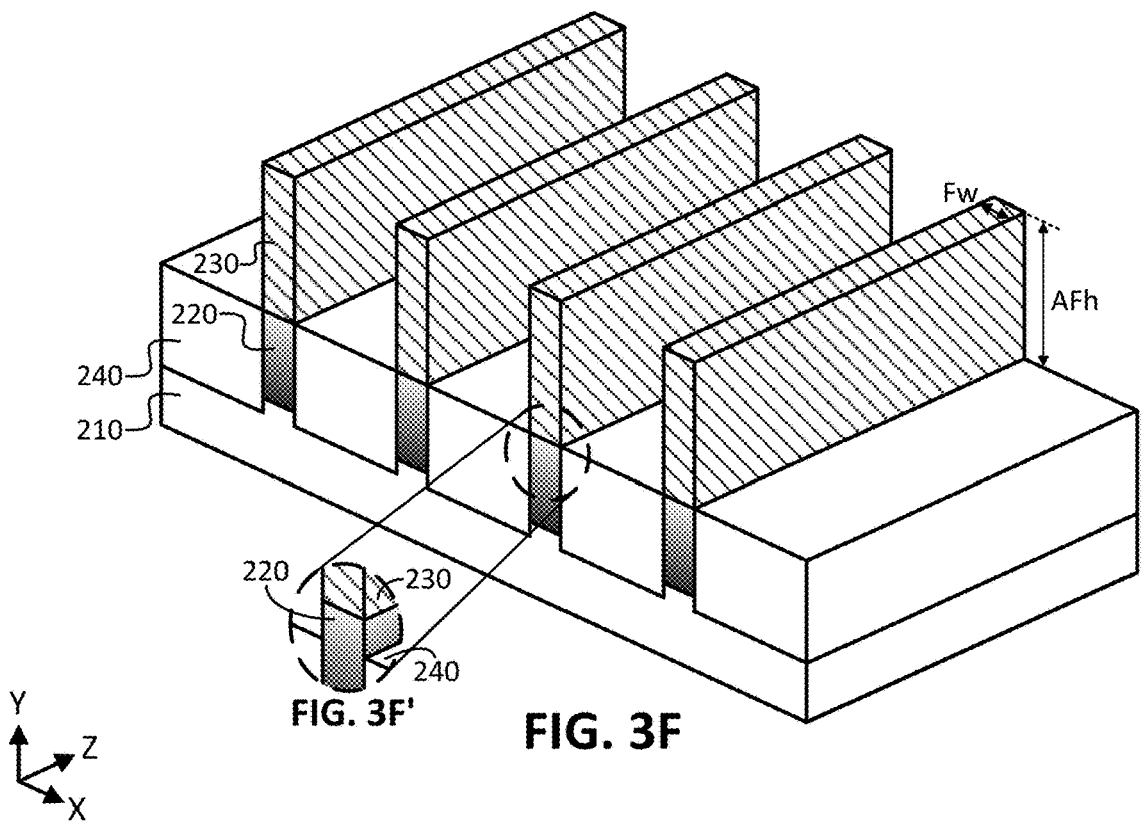
Figure 3I:
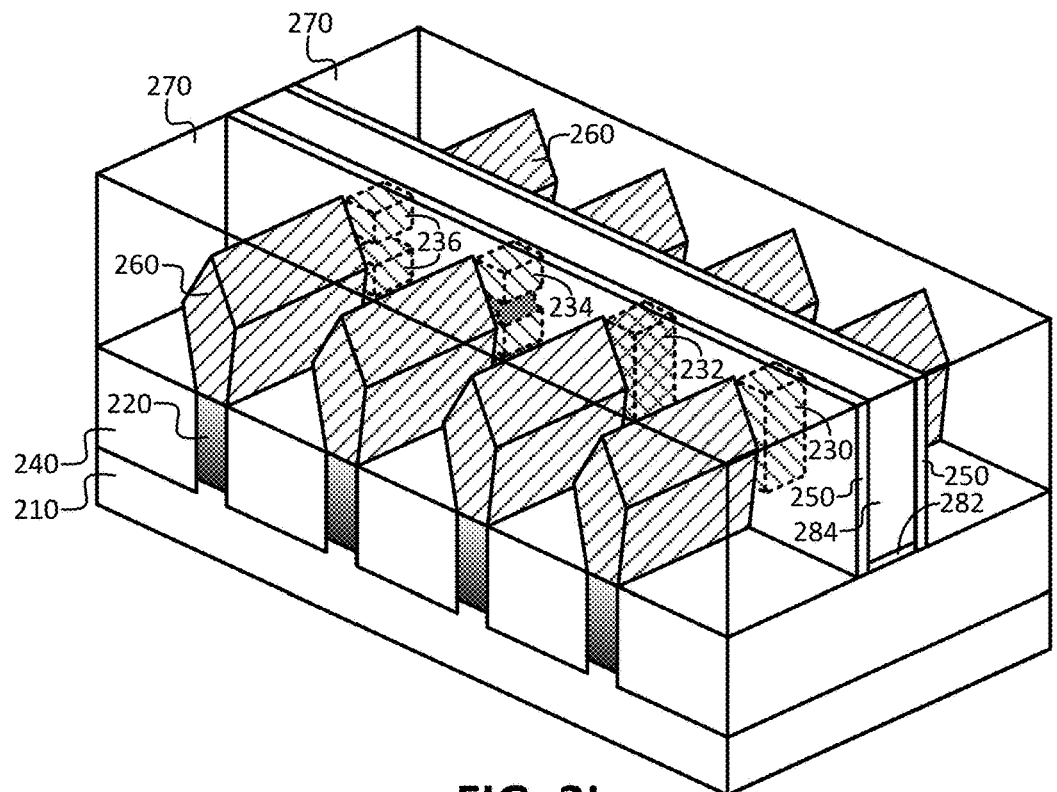

Regardless of whether a blanket deposition approach (e.g., using processes 102-110) or a replacement fin-based approach (such as approach 111 described above) is used to form the structure of FIG. 3E, method 100 of FIG. 1 can continue to box 112 which includes optionally recessing the STI material 240 to a desired level to form the example resulting structure of FIG. 3F, in accordance with some embodiments. Note that in some embodiments, recess 112 is optional and need not be performed, such as for transistors employing planar configurations, for example. For instance, in some such embodiments, transistors may be formed using the top surface of channel material layer 230, as can be understood based on this disclosure. However, in the example embodiment of FIG. 3F, STI material 240 was recessed to allow a portion of the original fins to exude above the top surface of STI material 240 as shown. In some embodiments, recessing 112, where performed, may include any suitable techniques, such as using one or more wet and/or dry etch processes that allow the STI material 240 to be selectively recessed relative to the fin material, and/or any other suitable processing as will be apparent in light of this disclosure.

In the example embodiment of FIG. 3F, the STI material 240 was recessed such that only the entirety of the channel material layer 230 portion of the fins is above the top surface of the STI material 240, as shown. Thus, the top plane of the STI material 240 is at the same level as the interface between the Ge-based layer 220 and the channel material layer 230, in this example case. As can be understood based on this disclosure, that portion of the fin that exudes above the top plane/surface of the STI material 240 may be used in the active channel region of one or more transistors, such that those fin portions may be referred to as active fin portions herein, for example. Moreover, the remaining portions of the fins extending from substrate 210 and below the top plane of STI layer 240 are may be referred to as sub-fin or sub-channel portions, for example, as that structure will be below the channel region of the subsequently formed transistor devices, in at least one IC orientation. FIG. 3F' illustrates a blown-out portion of FIG. 3F showing an alternative STI material 240 recess location, in accordance with some embodiments.

As shown in FIG. 3F', the recess resulted in the top surface of the STI material 240 being below the interface between the Ge-based layer 220 and the channel material layer 230, such that a top portion of Ge-based layer 220 would be a part of the active fin height, as can be understood based on this disclosure.

Generally, the active fin height, indicated as AFh, may be in the range of 4-800 nm (e.g., in the subrange of 4-10, 4-20, 4-50, 4-100, 4-200, 4-400, 10-20, 10-50, 10-100, 10-200, 10-400, 10-800, 50-100, 50-200, 50-400, 50-800, 100-400, 100-800, or 400-800 nm), for example, or any other suitable value or range, as will be apparent in light of this disclosure. In some embodiments, the active fin heights AFh may be at least 25, 50, 75, 100, 125, 150, 175, 200, 300, 400, 500, 600, 700, or 800 nm tall, or greater than any other suitable threshold height as will be apparent in light of this disclosure. The previous relevant description with respect to fin width Fw is equally applicable to the active fin width (which is also indicated as Fw, as it did not change). As can be understood based on this disclosure, the active fin height is the portion of the original fins formed on substrate 210 that will be included in a transistor channel region, while the remainder of the fin, which is the portion below that active fin height, is referred to as a sub-fin or sub-channel portion. Numerous different active channel regions may be formed as will be apparent in light of this disclosure.

Method 100 of FIG. 1 continues with forming 114 the dummy or final gate stack in accordance with some embodiments. As previously described, a gate last fabrication process may utilize a dummy gate stack to allow for replacement gate processing, while a gate first fabrication process may form the final gate stack in the first instance. Continuing from the example structure of FIG. 3F, the processing is primarily described herein in the context of a gate last transistor fabrication flow, where the processing includes forming a dummy gate stack, performing the S/D processing, and then forming the final gate stack after the S/D regions have been processed. In other embodiments, the techniques may be performed using a gate first process flow. In such example embodiments, a dummy gate stack need not be formed, as the final gate stack can be formed in the first instance. However, the description of the continued processing will be described using a gate last process flow, to allow for such a gate last flow (which may include additional processing) to be adequately described. Regardless, the end structure of either a gate first or a gate last process flow will include the final gate stack, as will be apparent in light of this disclosure. In this example embodiment, the processing includes forming a dummy gate stack (which includes dummy gate dielectric 252 and dummy gate electrode 254) on the structure of FIG. 3F, thereby forming the example resulting structure of FIG. 3G, in accordance with some embodiments. Recall, the formation of the dummy gate stack is optional, because it need not be performed in all embodiments (such as those employing a gate first process flow). In this example embodiment, dummy gate dielectric 252 (e.g., dummy oxide material) and dummy gate electrode 254 (e.g., dummy poly-silicon material) may be used for a replacement gate process. Note that side-wall spacers 250, referred to generally as gate spacers (or simply, spacers), on either side of the dummy gate stack were also formed, and such spacers 250 can help determine the channel length and/or help with replacement gate processing, for example.

As can be understood based on this disclosure, the dummy gate stack (and spacers 250) help define the channel region and source/drain (S/D) regions of each fin, where the channel region is below the dummy gate stack (as it will be located below the final gate stack), and the S/D regions are on either side of and adjacent the channel region. Note that because the IC structures are being described in the context of forming finned transistors, the final gate stack will also be adjacent to either side of the fin, as the gate stack will reside along three walls of the finned channel regions and/or wrap around the active fin portion from one region of STI material 240 to another region of STI material, in some such embodiments. Formation of the dummy gate stack may include depositing the dummy gate dielectric material 252 and dummy gate electrode material 254, patterning the dummy gate stack, depositing gate spacer material 250, and performing a spacer etch to form the structure shown in FIG. 3G, for example. Spacers 250 may include any suitable material, such as any suitable electrical insulator, dielectric, oxide (e.g., silicon oxide), and/or nitride (e.g., silicon nitride) material, as will be apparent in light of this disclosure. Note that in some embodiments, a hardmask (not shown) may be formed over the dummy gate stack (which may or may not also be formed over spacers 250) to protect the dummy gate stack during subsequent processing, for example.

Method 100 of FIG. 1 continues with performing 116 source and drain (S/D) region processing to form the example resulting structure of FIG. 3H, in accordance with some embodiments. The S/D regions 260, in some embodiments, may be formed using any suitable techniques, such as masking regions outside of the S/D regions to be processed, etching at least a portion of the exposed fins from the structure of FIG. 3G, and forming/depositing/growing the S/D regions 260 (e.g., using any suitable techniques, such as CVD, PVD, ALD, VPE, MBE, LPE), for example. However, in some embodiments, the exposed fins (which in the embodiment of FIG. 3G includes channel material layer 230) need not be completely removed, but they may remain (at least in part) in the final S/D regions and be doped, implanted, and/or clad with final S/D material and/or have any other suitable processing performed to convert them into suitable final S/D regions, for example. For instance, FIG. 3H' illustrates a blown-out portion of FIG. 3H showing an S/D region formed using a cladding scheme, in accordance with some embodiments. As shown in FIG. 3H', the final S/D material 260' was formed on the original exposed fin in that S/D location (which included channel material layer 230). In the example embodiment of FIG. 3H, as the material of the S/D regions 260 is replacement material, there is a distinct interface between the underlying sub-fin portions and S/D regions 260, as shown in FIG. 3H. In some embodiments, one or more of the S/D regions 260 may have a multilayer structure including two or more distinct layers, for example. For instance, in FFFET configurations, the source region has a bi-layer structure that includes two oppositely doped layers (e.g., one is n-type doped and the other is p-type doped), for example. In some embodiments, one or more of the S/D regions 260 may include grading (e.g., increasing and/or decreasing) the content/concentration of one or more materials in some or all of the region(s). For instance, in some embodiments, it may be desired to increase the grading as a given S/D region 260 is formed, to have a relatively lower doping concentration near the channel region and a relatively higher doping concentration near the corresponding S/D contact.

In some embodiments, the S/D regions 260 may be formed one polarity at a time, such as performing processing for one of n-type and p-type S/D regions, and then performing processing for the other of the n-type and p-type S/D regions. In some embodiments, the S/D regions may include any suitable material, such as monocrystalline group IV and/or group III-V semiconductor material and/or any other suitable semiconductor material, as will be apparent in light of this disclosure. In some embodiments, the S/D regions corresponding to a given channel region may include the same group of semiconductor material as what is included in the given channel region, such that if the given channel region includes group IV semiconductor material, the corresponding S/D regions may also include group IV semiconductor material (whether the same IV material or different); however, the present disclosure is not intended to be so limited. In some embodiments, the S/D regions may include any suitable doping scheme, such as including suitable n-type and/or p-type dopant (e.g., in a concentration in the range of 1E16 to 1E22 atoms per cubic cm). However, in some embodiments, at least one S/D region 260 may be undoped/intrinsic or relatively minimally doped, such as including a dopant concentration of less than 1E16 atoms per cubic cm, for example.

To provide some example configurations, in embodiments where corresponding S/D regions on either side of a given channel region are to be used for a MOSFET device, the S/D regions may include the same type of dopants (e.g., where both are p-type doped or both are n-type doped). Specifically, for an NMOS device, the included S/D regions include semiconductor material that is n-type doped, and for a PMOS device, the included S/D regions include semiconductor material that is p-type doped, in some embodiments. Whereas for a TFET device, the S/D regions for a given channel region may be oppositely doped, such that one is p-type doped and the other is n-type doped, in some embodiments. Note that for ease of illustration and description, all S/D regions are shown as being the same and are identified collectively by numeral 260. However, in some embodiments, the S/D regions 260 may include differing materials, dopant schemes, shapes, sizes, corresponding channel regions (e.g., 1, 2, 3, or more), and/or any other suitable difference as can be understood based on this disclosure. For instance, the S/D regions 260 of FIG. 3H includes pentagon or diamond-like shape (as viewed in the X-Y plane), while the S/D region 260' of FIG. 3H' includes a rounded or curved hill-like shape (as viewed in the X-Y plane), to provide a few examples. Further note that the shading or patterning of the features/layers of the IC structures included in FIGS. 2A-D, 3A-J, and 4 (such as S/D regions 260) is provided merely to assist in visually distinguishing those different IC features/layers. Such shading or patterning is not intended to limit the present disclosure in any manner. Numerous transistor S/D configurations and variations will be apparent in light of this disclosure.

Method 100 of FIG. 1 continues with performing 118 the final gate stack processing to form the example resulting structure of FIG. 3I, in accordance with some embodiments. As shown in FIG. 3I, the processing in this example embodiment included depositing interlayer dielectric (ILD) material 270 on the structure of FIG. 3H, followed by optional planarization and/or polishing (e.g., CMP) to reveal the dummy gate stack. Note that the ILD material 270 is shown as transparent in the example structure of FIG. 3H to allow for the underlying features to be seen (and the ILD material 270 may actually be transparent or translucent at such a small scale); however, the present disclosure is not intended to be so limited. Also note that the ILD layer 270 may include a multilayer structure, even though it is illustrated as a single layer. Further note that in some cases, ILD material 270 and STI material 240 may not include a distinct interface as shown in FIG. 3H, particularly where, e.g., the ILD layer 270 and STI material 240 include the same dielectric material. In some embodiments, the ILD layer 270 may include any suitable material, such as one or more oxides (e.g., silicon oxide), nitrides (e.g., silicon nitride), dielectrics, and/or electrically insulating material, for example.

The gate stack processing, in this example embodiment, continued with removing the dummy gate stack (including dummy gate electrode 254 and dummy gate dielectric 252) to allow for the final gate stack to be formed. Recall that in some embodiments, the formation of the final gate stack, which includes gate dielectric 282 and gate electrode 284, may be performed using a gate first fabrication flow (e.g., an up-front hi-k gate process). In such embodiments, the final gate processing may have been performed prior to the S/D processing, for example. Further, in such embodiments, process 118 need not be performed, as the final gate stack would have been formed at box 114, for example. However, in this example embodiment, the gate stack is formed using a gate last fabrication flow, which may also be considered a replacement gate or replacement metal gate (RMG) process. In such gate last processing, the process may include dummy gate oxide deposition, dummy gate electrode (e.g., poly-Si) deposition, and, optionally, patterning hardmask deposition, as previously described. Regardless of whether gate first or gate last processing is employed, the final gate stack can include gate dielectric 282 and gate electrode 284 as shown in FIG. 3H and described herein, in accordance with some embodiments.

Note that when the dummy gate is removed, the channel regions of the previously formed fins (which include channel material layer 230, in this example case) that were covered by the dummy gate are exposed to allow for any desired processing of those channel regions of the fins. Such processing of the channel regions may include various different techniques, such as removing and replacing the channel region with replacement material, doping the channel region of the fin as desired, forming the fin into one or more nanowires (or nanoribbons) for a gate-all-around (GAA) transistor configuration, forming the fin into a beaded-fin configuration, cleaning/polishing the channel region, and/or any other suitable processing as will be apparent in light of this disclosure. For instance, finned channel regions 230 and 232 are illustrated (which are the channel regions of the right-most finned structure and the second-from-the-right finned structure, respectively), where finned channel region 230 includes the channel material layer (and in other embodiments, may include at least a portion of the Ge-based layer 220, such as in the case of the structure of FIG. 3F') and the second finned channel region 232 may include any other suitable configuration. For instance, in some embodiments, second finned channel region 232 may include a second channel material layer that is compositionally different from the first channel material layer 230, to provide some examples. Thus, and as was previously described, finned channel region 230 may be used for an n-channel or p-channel finned transistor device, while second finned channel region 232 may be used for the other of an n-channel or p-channel finned transistor device, in accordance with an example embodiment. Further, in such an example embodiment, both of the finned channel regions 230 and 232 may be included in a complementary transistor circuit (e.g., a CMOS circuit), for instance.

Other non-planar transistor configurations (that is, other than finned configurations, which may utilize a tri-gate or double-gate scheme) are also shown in the example structure of FIG. 3I. For instance, nanowire channel region 236 may have been formed after the dummy gate stack was removed and the channel regions were exposed, by converting an original finned structure at that location into the nanowires 236 shown using, for example, any suitable techniques. For instance, the original finned channel region may have included a multilayer structure, where one or more of the layers were sacrificial and selective etch processing was performed to remove those sacrificial layers and release the nanowires 236. As shown in FIG. 3I, nanowire channel region 236 includes 2 nanowires (or nanoribbons) in this example case. However, a nanowire (or nanoribbon or GAA) transistor formed using the techniques disclosed herein may include any number of nanowires (or nanoribbons) such as 1, 3, 4, 5, 6, 7, 8, 9, 10, or more, depending on the desired configuration. In some embodiments, a nanowire or nanoribbon may be considered fin-shaped where the gate stack wraps around each fin-shaped nanowire or nanoribbon in a GAA transistor configuration. To provide yet another example non-planar transistor configuration, beaded-fin channel region 234 is a hybrid between a finned channel region and a nanowire channel region, where the sacrificial material (shown with grey shading) that may have been completely removed to release nanowires was instead only partially removed to form the resulting beaded-fin structure 234 shown. Such a beaded-fin channel region structure may benefit from, for instance, increased gate control (e.g., compared to a finned channel region structure) while also having, for instance, relatively reduced parasitic capacitance (e.g., compared to a nanowire channel region structure). Therefore, numerous different channel region configurations can be employed using the techniques described herein, including planar and a multitude of non-planar configurations.

As can be understood based on this disclosure, the channel region may be at least below the gate stack, in some embodiments. For instance, in the case of a planar transistor configuration, the channel region may just be below the gate stack. However, in the case of a finned transistor configuration, the channel region may be below and between the gate stack, as the gate stack may be formed on three sides of the finned structure (e.g., in a tri-gate manner), as is known in the art. Further, in the case of a nanowire (or nanoribbon or GAA) transistor configuration, the gate stack may substantially (or completely) surround each nanowire/nanoribbon in the channel region (e.g., wrap around at least 80, 85, 90, or 95% of each nanowire/nanoribbon). Regardless, in some embodiments, the gate of a transistor may be proximate to the channel region of that transistor. Generally, in some embodiments, the channel region may include any suitable material, such as monocrystalline group IV and/or group III-V semiconductor material, for example. In some embodiments, the channel region of a given transistor may be doped (e.g., with any suitable n-type and/or p-type dopants) or intrinsic/undoped, depending on the particular configuration. Note that S/D regions 260 are adjacent to either side of a given channel region, as can be seen in FIG. 3I. In other words, each channel region is between corresponding S/D regions 260. Also note that the configuration/geometry of a transistor formed using the techniques described herein may primarily be described based on the shape/configuration of the respective channel region of that transistor, for example. For instance, a nanowire (or nanoribbon or GAA) transistor may be referred to as such because it includes one or more nanowires (or nanoribbons) in the channel region of that transistor, but the S/D regions need not include such a nanowire (or nanoribbon) shape.

Continuing with the example structure of FIG. 3I, after the dummy gate has been removed and any desired channel region processing has been performed, the final gate stack can be formed, in accordance with some embodiments. In this example embodiment, the final gate stack includes gate dielectric 282 and gate electrode 284, as shown in FIG. 3I. The gate dielectric 282 may include, for example, any suitable oxide (such as silicon dioxide), high-k dielectric material, and/or any other suitable material as will be apparent in light of this disclosure. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. In some embodiments, an annealing process may be carried out on the gate dielectric 282 to improve its quality when high-k dielectric material is used. The gate electrode 284 may include a wide range of materials, such as polysilicon or various suitable metals or metal alloys, such as aluminum (Al), tungsten (W), titanium (Ti), tantalum (Ta), copper (Cu), titanium nitride (TiN), or tantalum nitride (TaN), for example.

In some embodiments, gate dielectric 282 and/or gate electrode 284 may include a multilayer structure of two or more material layers, for example. For instance, in some embodiments, a multilayer gate dielectric may be employed to provide a more gradual electric transition from the channel region to the gate electrode, for example. In some embodiments, gate dielectric 282 and/or gate electrode 284 may include grading (e.g., increasing and/or decreasing) the content/concentration of one or more materials in at least a portion of the feature(s). One or more additional layers may also be present in the final gate stack, in some embodiments, such as one or more relatively high or low work function layers and/or other suitable layers, for example. Note that although gate dielectric 282 is only shown below gate electrode 284 in the example embodiment of FIG. 3I, in other embodiments, the gate dielectric 282 may also be present on one or both sides of gate electrode 284, such that the gate dielectric 282 is between gate electrode 284 and one or both spacers 250, for example. Numerous different gate stack configurations will be apparent in light of this disclosure.

Figure 3J:
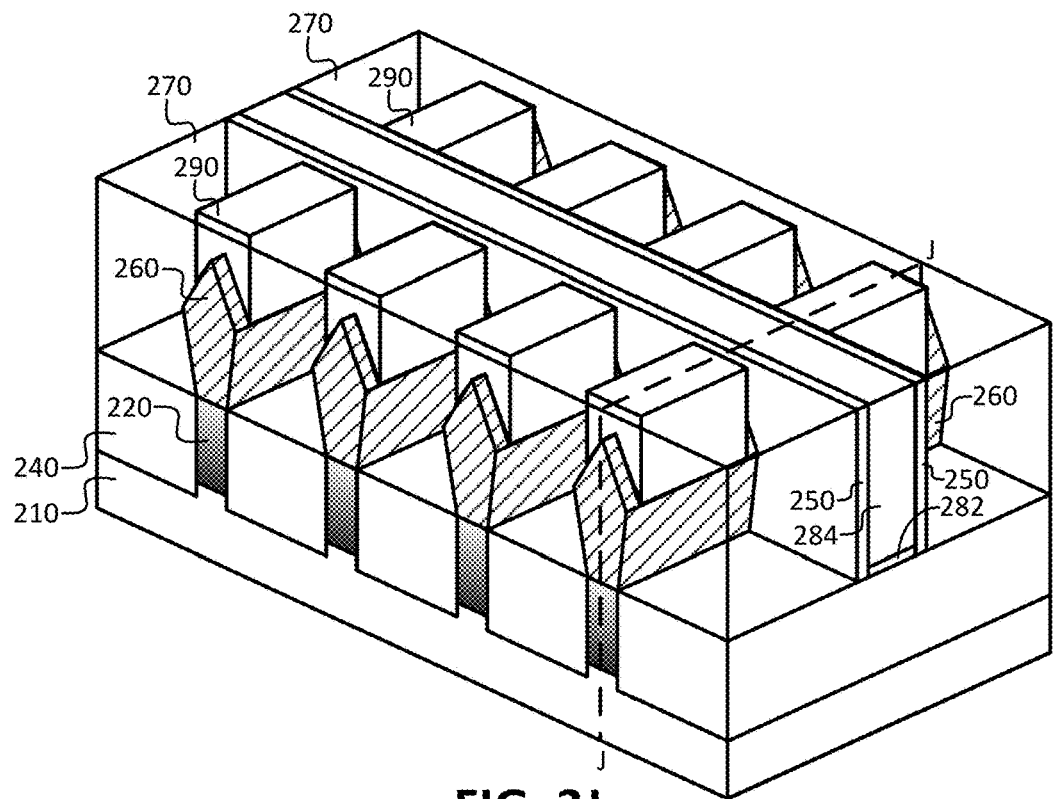

Method 100 of FIG. 1 continues with performing 120 S/D contact processing to form the example resulting structure of FIG. 3J, in accordance with some embodiments. As shown in FIG. 3J, S/D contacts 290 were formed to make contact to each of the S/D regions 260, in this example embodiment. In some embodiments, S/D contacts 290 may be formed using any suitable techniques, such as forming contact trenches in ILD layer 270 over the respective S/D regions 260 and depositing metal or metal alloy (or other suitable electrically conductive material) in the trenches. In some embodiments, S/D contact 290 formation may include silicidation, germanidation, III-V-idation, and/or annealing processes, for example. In some embodiments, S/D contacts 290 may include aluminum or tungsten, although any suitable conductive metal or alloy can be used, such as silver, nickel-platinum, or nickel-aluminum, for example. In some embodiments, one or more of the S/D contacts 290 may include a resistance reducing metal and a contact plug metal, or just a contact plug, for instance. Example contact resistance reducing metals include, for instance, nickel, aluminum, titanium, gold, gold-germanium, nickel-platinum, nickel aluminum, and/or other such resistance reducing metals or alloys. Example contact plug metals include, for instance, aluminum, copper, nickel, platinum, titanium, or tungsten, or alloys thereof, although any suitably conductive contact metal or alloy may be used. In some embodiments, additional layers may be present in the S/D contact 290 regions, such as adhesion layers (e.g., titanium nitride) and/or liner or barrier layers (e.g., tantalum nitride), if so desired. In some embodiments, a contact resistance reducing layer may be present between a given S/D region 260 and its corresponding S/D contact 290, such as a relatively highly doped (e.g., with dopant concentrations greater than 1E18, 1E19, 1E20, 1E21, or 1E22 atoms per cubic cm) intervening semiconductor material layer, for example. In some such embodiments, the contact resistance reducing layer may include semiconductor material and/or impurity dopants based on the included material and/or dopant concentration of the corresponding S/D region, for example.

Method 100 of FIG. 1 continues with completing 122 general integrating circuit (IC) processing as desired, in accordance with some embodiments. Such additional processing to complete an IC may include back-end or backend-of-line (BEOL) processing to form one or more metallization layers and/or to interconnect the transistor devices formed, for example. Any other suitable processing may be performed, as will be apparent in light of this disclosure. Note that the processes 102-122 in method 100 of FIG. 1 are shown in a particular order for ease of description. However, one or more of the processes may be performed in a different order or may not be performed at all (and thus be optional), in accordance with some embodiments. For example, processes 112 and 118 may be optional in some embodiments, as previously described. Further, processes 102-110 may be alternatively performed using a replacement fin-based approach 111, in accordance with some embodiments. Numerous variations on method 100 and the techniques described herein will be apparent in light of this disclosure.

Figure 4:
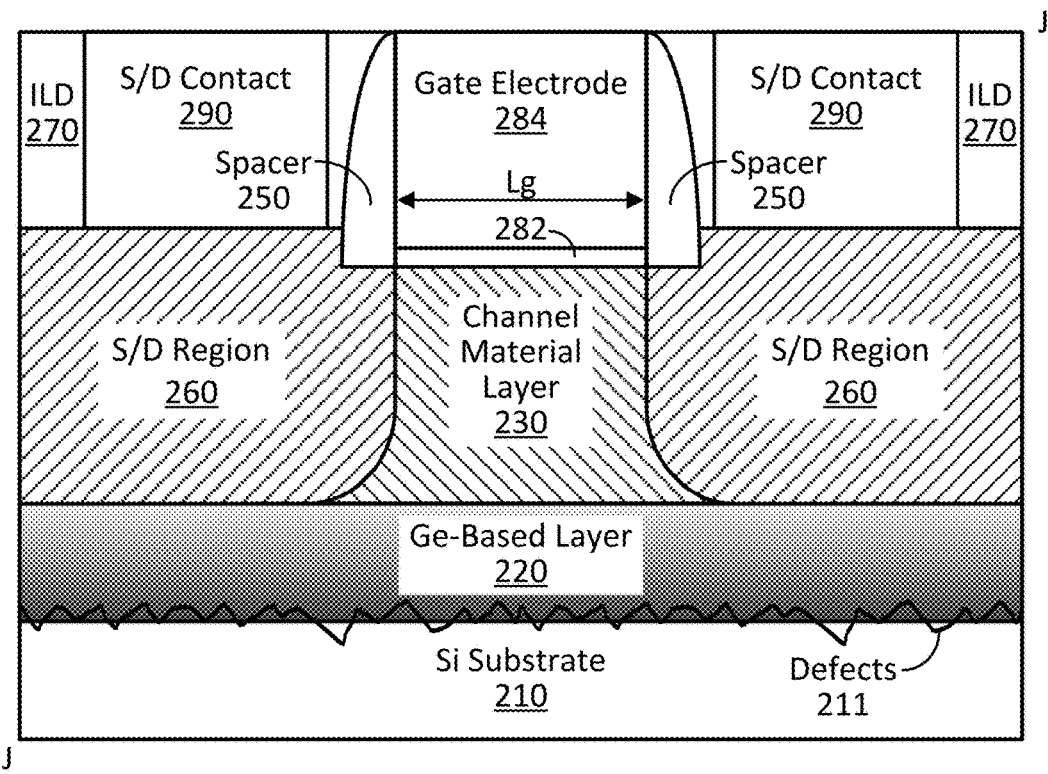
FIG. 4 illustrates an example cross-sectional view taken along the plane J-J in FIG. 3J, in accordance with some embodiments of the present disclosure.

FIG. 4 illustrates an example cross-sectional view taken along the plane J-J in FIG. 3J, in accordance with some embodiments of the present disclosure. The cross-sectional view of FIG. 4 is provided to assist in illustrating different features of the structure of FIG. 3J, for example. Therefore, the previous relevant description with respect to the each similarly numbered feature is equally applicable to FIG. 4. However, note that the dimensions of the features shown in FIG. 4 may differ in some ways (relative to the features in the structure of FIG. 3J), for ease of illustration. Also note that some variations occur between the structures, such as the shape of spacers 250 and of the finned channel region (which includes channel material layer 230, in the example embodiments), for instance. In some embodiments, the length of gate electrode 284 (e.g., the dimension between spacers 250 in the Z-axis direction), which is indicated as Lg, may be any suitable length as can be understood based on this disclosure. For instance, in some embodiments, the gate length may be in the range of 3-100 nm (e.g., 3-10, 3-20, 3-30, 3-50, 5-10, 5-20, 5-30, 5-50, 5-100, 10-20, 10-30, 10-50, 10-100, 20-30, 20-50, 20-100, or 50-100 nm), or any other suitable value or range as will be apparent in light of this disclosure. In some embodiments, the gate length may be less than a given threshold, such as less than 100, 50, 40, 30, 25, 20, 15, 10, 8, or 5 nm, or less than any other suitable threshold as will be apparent in light of this disclosure. For instance, in some embodiments, the gate length may be the same as or similar to the channel length (e.g., the gate length may be approximately longer than the channel length, such as 1-20% longer, due to potential diffusion of dopant from the S/D regions into the channel region and/or due to the use of S/D region tips that extend under the gate stack), which may also be any suitable length as can also be understood based on this disclosure. In some embodiments, the techniques enable maintaining a desired device performance when scaling to such low thresholds, such as sub-50, sub-40, sub-30, or sub-20 nm thresholds, as can be understood based on this disclosure.

Figure 5:
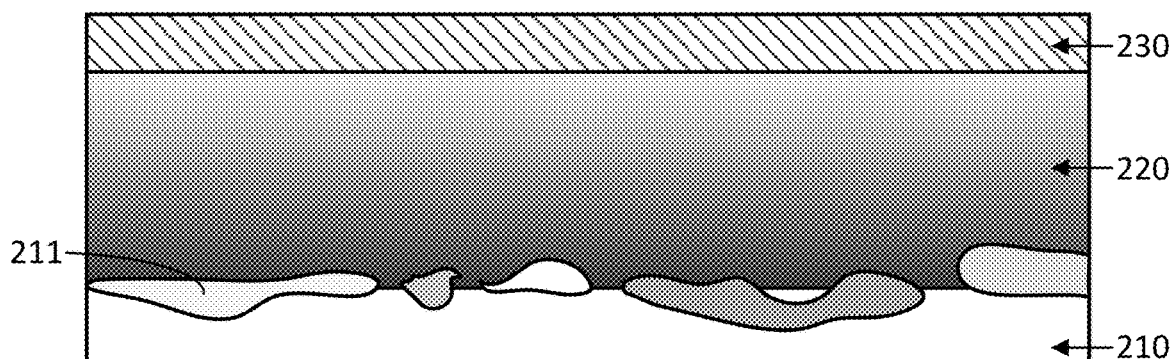
FIG. 5 is a schematic of a transmission electron microscopy (TEM) image showing an example stack of layers including a Si substrate, Ge-based layer, and channel material layer to illustrate defects nucleating at the substrate/Ge-based layer interface, in accordance with some embodiments of the present disclosure.

FIG. 5 is a schematic of a transmission electron microscopy (TEM) image showing an example stack of layers including Si substrate 210, Ge-based layer 220, and channel material layer 230 to illustrate defects 211 nucleating at the substrate 210/Ge-based layer 220 interface, in accordance with some embodiments of the present disclosure. The 210/220/230 stack of layers is also shown in FIG. 2C, for example. As was previously stated, in the IC stack of layers described herein, the inverse-graded nature and/or relatively high Ge concentration at the bottom of the Ge-based layer 220 causes the formation of defects (e.g., dislocations and/or stacking faults) that are predominantly contained within the Ge-based layer 220 rather than running through to layer 230. In some cases, the defects 211, which are also illustrated in the structure of FIG. 4, may propagate from the 210/220 interface toward the Si substrate 210 and/or toward the Ge-based layer 220, such that the defects may be considered to be in the Si substrate and/or in the Ge-based layer 220, for example. The defects may create nooks, crannies, voids, valleys, material separations, and/or other such features at the interface between the Si substrate 210 and the Ge-based layer 220, for example. As such, that 210/220 interface may not be readily apparent, but may instead primarily appear as the defects 211 that it helps create. Therefore, in some embodiments, the techniques described herein may be identified based on the presence of defects that are at least in part (or primarily) trapped or contained near the interface between the Si substrate 210 and the Ge-based layer 220.

In some embodiments, the top portion/surface of the Ge-based layer 220 may have a relatively low defect or dislocation density, such as less than 1E9 per square cm, which is the typical minimum threshold defect/dislocation density that would form at the top portion/surface of the Ge-based layer 220 if inverse grading of the Ge concentration within the layer were not employed. In some such embodiments, the top portion/surface of the Ge-based layer 220 may have a defect/dislocation density of at most 1E9, 5E8, 1E8, 5E7, 1E7, 5E6, 1E6, 5E5, 1E5, 5E4, or 1E4 per square cm, for example. In some embodiments, the top portion/surface of the Ge-based layer 220 may include essentially no defects or dislocations, as they may terminate prior to reaching that top portion/surface. As can be understood based on this disclosure, the techniques described herein for forming a thin, inverse-graded, Ge-based layer allows for the formation of a multitude of different transistor types/configurations/architectures, with various different materials that may or may not be strained. Further, in some embodiments that employ multiple transistor devices (e.g., CMOS circuits), layers 220 and 230 can either be all the same between the multiple transistor devices, or one or both of the layers may be different (e.g., different between NMOS devices and PMOS devices). Numerous variations and configurations will be apparent in light of this disclosure.

Example System

Figure 6:
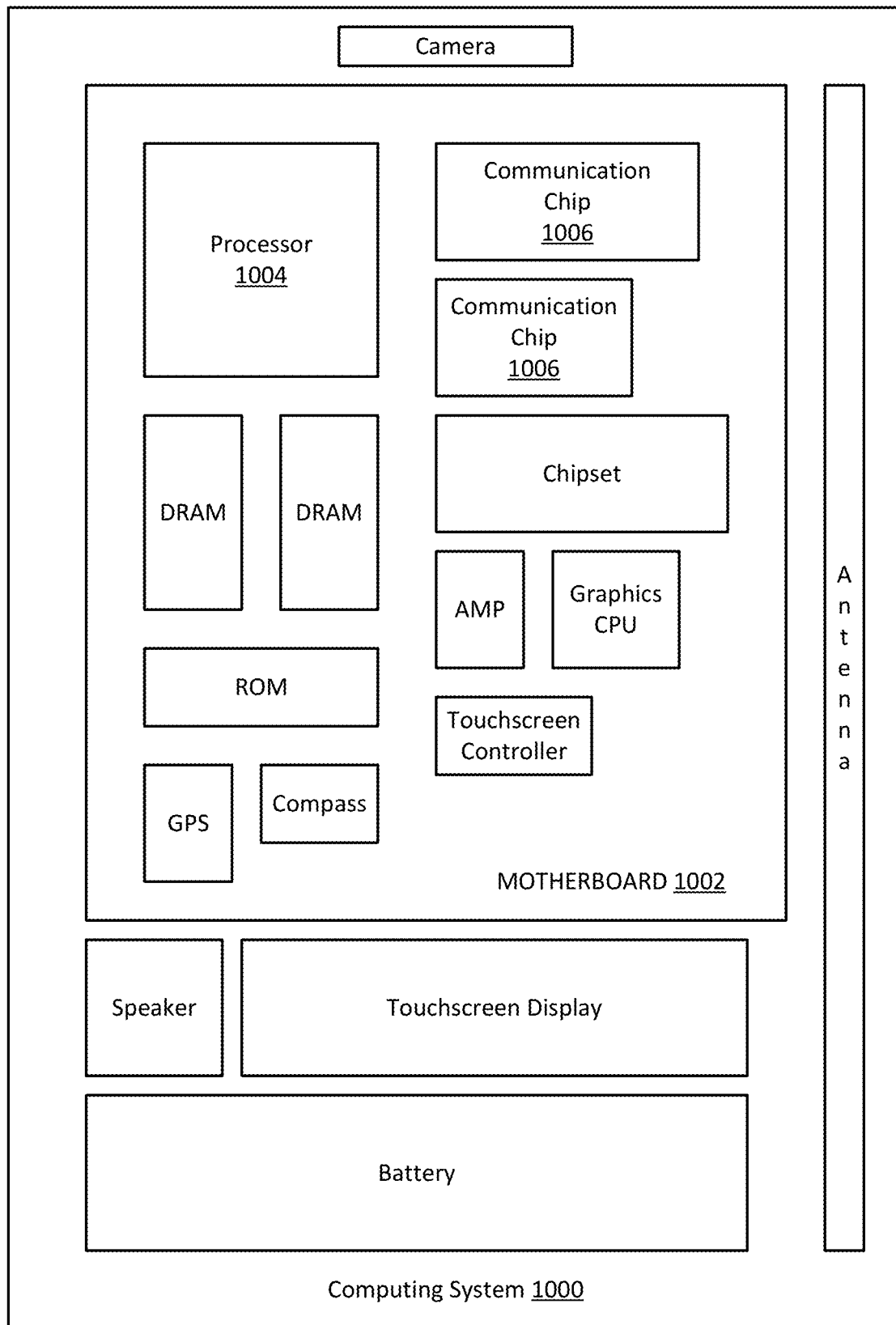
FIG. 6 illustrates a computing system implemented with integrated circuit structures and/or transistor devices formed using the techniques disclosed herein, in accordance with some embodiments of the present disclosure.

FIG. 6 illustrates a computing system 1000 implemented with integrated circuit structures and/or transistor devices formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1 is an integrated circuit (IC) including at least one transistor, the IC including: a substrate that includes silicon; a layer above the substrate and including monocrystalline semiconductor material; an intervening layer between the substrate and the layer, the intervening layer having a maximum vertical thickness of at most 400 nanometers (nm), the intervening layer including a first germanium concentration by atomic percentage near the substrate and a second germanium concentration by atomic percentage near the layer, wherein the first germanium concentration is at least 10 percent greater by atomic percentage than the second germanium concentration; a channel region including the layer; a gate structure at least above the channel region; a source region adjacent the channel region; and a drain region adjacent the channel region.

Example 2 includes the subject matter of Example 1, wherein the substrate is a bulk silicon wafer.

Example 3 includes the subject matter of Example 1 or 2, wherein the layer includes monocrystalline group IV semiconductor material.

Example 4 includes the subject matter of any of Examples 1-3, wherein the layer includes monocrystalline group III-V semiconductor material.

Example 5 includes the subject matter of any of Examples 1-4, wherein the layer includes a thickness of at most 200 nm.

Example 6 includes the subject matter of any of Examples 1-5, wherein the layer is strained to a lattice parameter value of a top surface of the intervening layer, such that in-plane lattice parameters of the layer are within 30 percent of the in-plane lattice parameter of the top portion of the intervening layer.

Example 7 includes the subject matter of any of Examples 1-6, wherein the intervening layer includes a top surface dislocation density of at most 1E7 per square centimeter.

Example 8 includes the subject matter of any of Examples 1-7, wherein the first germanium concentration is at least 50 percent germanium concentration by atomic percentage.

Example 9 includes the subject matter of any of Examples 1-8, wherein the second germanium concentration is at least 20 percent germanium concentration by atomic percentage.

Example 10 includes the subject matter of any of Examples 1-9, wherein the first germanium concentration is at least 30 percent greater by atomic percentage than the second germanium concentration.

Example 11 includes the subject matter of any of Examples 1-10, wherein a transition from the first germanium concentration to the second germanium concentration includes gradual grading of the germanium concentration.

Example 12 includes the subject matter of any of Examples 1-10, wherein a transition from the first germanium concentration to the second germanium concentration is in a step-wise manner, such that the intervening layer has a multilayer structure.

Example 13 includes the subject matter of any of Examples 1-12, wherein the intervening layer includes a plurality of defects which nucleate at an interface between the substrate and the intervening layer, a majority of the defects being contained within the intervening layer such that the majority of defects are not in the layer.

Example 14 includes the subject matter of any of Examples 1-13, wherein the layer is one of n-type and p-type doped and the intervening layer is the other of n-type and p-type doped relative to the layer.

Example 15 includes the subject matter of any of Examples 1-14, wherein the channel region includes at least a portion of the intervening layer.

Example 16 includes the subject matter of any of Examples 1-15, wherein the at least one transistor is a non-planar transistor.

Example 17 includes the subject matter of any of Examples 1-16, further including a complementary metal-oxide-semiconductor (CMOS) circuit including a first transistor including the channel region and a second transistor formed above the intervening layer, wherein one of the first and second transistors is an n-channel transistor and the other of the first and second transistors is a p-channel transistor.

Example 18 includes the subject matter of Example 17, wherein the n-channel transistor includes tensile strain throughout a corresponding channel region and the p-channel transistor includes compressive strain throughout a corresponding channel region.

Example 19 is a computing system including the subject matter of any of Examples 1-18.

Example 20 is an integrated circuit (IC) including at least one transistor, the IC including: a substrate that includes silicon; an first layer on the substrate and including silicon and germanium, the first layer having a maximum vertical thickness of at most 400 nanometers (nm); a second layer on the first layer and including monocrystalline semiconductor material; a channel region including the second layer; a gate structure at least above the channel region; a source region adjacent the channel region; and a drain region adjacent the channel region wherein the first layer further has a first lattice parameter value near the substrate and a second lattice parameter value near the second layer, the first lattice parameter value being greater than the second lattice parameter value.

Example 21 includes the subject matter of Example 20, wherein the substrate is a bulk silicon wafer.

Example 22 includes the subject matter of Example 20 or 21, wherein the second layer includes monocrystalline group IV semiconductor material.

Example 23 includes the subject matter of any of Examples 20-22, wherein the second layer includes monocrystalline group III-V semiconductor material.

Example 24 includes the subject matter of any of Examples 20-23, wherein the second layer includes a thickness of at most 200 nm.

Example 25 includes the subject matter of any of Examples 20-24, wherein the second layer is strained to a lattice parameter of a top portion of the first layer, such that in-plane lattice parameters of the second layer are within 30 percent of the in-plane lattice parameter of the top portion of the first layer.

Example 26 includes the subject matter of any of Examples 20-25, wherein the first layer includes a top surface dislocation density of at most 1E7 per square centimeter.

Example 27 includes the subject matter of any of Examples 20-26, wherein the first layer includes a first germanium concentration by atomic percentage near the substrate and a second germanium concentration by atomic percentage near the second layer, the first germanium concentration being at least 20 percent greater by atomic percentage than the second germanium concentration.

Example 28 includes the subject matter of any of Examples 20-27, wherein the first lattice parameter value is at least 0.05 angstroms at 300 Kelvin greater than the second lattice parameter value.

Example 29 includes the subject matter of any of Examples 20-28, wherein the first lattice parameter value is at least 5.55 angstroms at 300 Kelvin.

Example 30 includes the subject matter of any of Examples 20-29, wherein the second lattice parameter value is at least 5.47 angstroms at 300 Kelvin.

Example 31 includes the subject matter of any of Examples 20-30, wherein a transition from the first lattice parameter value to the second lattice parameter value is achieved via a gradual grading of the germanium concentration in the first layer.

Example 32 includes the subject matter of any of Examples 20-30, wherein a transition from the first lattice parameter value to the second lattice parameter value is achieved via a step-wise change of the germanium concentration in the first layer, such that the first layer has a multilayer structure.

Example 33 includes the subject matter of any of Examples 20-32, wherein the first layer includes a plurality of defects which nucleate at an interface between the substrate and the first layer, a majority of the defects being contained within the first layer such that the majority of defects are not in the second layer.

Example 34 includes the subject matter of any of Examples 20-33, wherein the second layer is one of n-type and p-type doped and the first layer is the other of n-type and p-type doped relative to the second layer.

Example 35 includes the subject matter of any of Examples 20-34, wherein the channel region includes at least a portion of the first layer.

Example 36 includes the subject matter of any of Examples 20-35, wherein the at least one transistor is a finned or nanowire transistor.

Example 37 includes the subject matter of any of Examples 20-36, further including a complementary metal-oxide-semiconductor (CMOS) circuit including a first transistor including the channel region and a second transistor formed above the first layer, wherein one of the first and second transistors is an n-channel transistor and the other of the first and second transistors is a p-channel transistor.

Example 38 includes the subject matter of Example 37, wherein the n-channel transistor includes tensile strain throughout a corresponding channel region and the p-channel transistor includes compressive strain throughout a corresponding channel region.

Example 39 is a mobile computing system including the subject matter of any of Examples 20-38.

Example 40 is a method of forming an integrated circuit (IC) including at least one transistor, the method including: providing a substrate that includes silicon; forming a first layer on the substrate and having a maximum vertical thickness of at most 400 nanometers (nm), the intervening layer including a first germanium concentration by atomic percentage near the substrate and a second germanium concentration by atomic percentage near the layer, wherein the first germanium concentration is at least 10 percent greater by atomic percentage than the second germanium concentration; forming a second layer on the substrate and including monocrystalline semiconductor material; forming a channel region including the second layer; forming a gate structure at least above the channel region; forming a source region adjacent the channel region; and forming a drain region adjacent the channel region.

Example 41 includes the subject matter of Example 40, wherein forming the first layer includes gradual grading of the germanium concentration in the first layer from the first germanium concentration to the second germanium concentration.

Example 42 includes the subject matter of Example 40, wherein forming the first layer includes a step-wise approach, such that the first layer includes a multilayer structure including a lower layer having the first germanium concentration and an upper layer having the second germanium concentration.

Example 43 includes the subject matter of any of Examples 40-42, wherein the first and second layers are formed via blanket deposition.

Example 44 includes the subject matter of any of Examples 40-42, wherein the first and second layers are formed in a fin-shaped trench above the substrate and between two regions of shallow trench isolation material.

Example 45 includes the subject matter of any of Examples 40-44, wherein the monocrystalline semiconductor material is a group IV semiconductor material.

Example 46 includes the subject matter of any of Examples 40-44, wherein the monocrystalline semiconductor material is a group III-V semiconductor material.

Example 47 includes the subject matter of any of Examples 40-46, wherein the second layer is strained to the first layer.

Example 48 includes the subject matter of Example 47, wherein the strain is compressive strain.

Example 49 includes the subject matter of Example 47, wherein the strain is tensile strain.

Example 50 includes the subject matter of any of Examples 40-49, wherein the second layer is one of n-type and p-type doped and wherein the first layer is the other of n-type and p-type doped relative to the second layer.

Example 51 includes the subject matter of any of Examples 40-50, wherein the gate structure is formed prior to forming the source and drain regions using a gate first fabrication process.

Example 52 includes the subject matter of any of Examples 40-50, wherein the gate structure is formed after forming the source and drain regions using a gate last fabrication process.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit (IC), comprising:
a substrate that includes silicon;
a strained channel structure;
an intervening layer between and in direct contact with the substrate and the strained channel structure, the intervening layer continuous from the substrate to the strained channel structure, and the intervening layer having a maximum vertical thickness of at most 400 nanometers (nm), the intervening layer including a first germanium concentration by atomic percentage near the substrate and a second germanium concentration by atomic percentage near the channel structure, wherein the first germanium concentration is at least 10 percent greater by atomic percentage than the second germanium concentration, wherein a concentration of germanium does not generally increase along a direction from the first germanium concentration to the second germanium concentration;
a gate structure at least above the channel structure;
a source region adjacent the channel structure; and
a drain region adjacent the channel structure, such that the channel structure is laterally between the source region and the drain region.

2. The IC of claim 1, wherein the substrate is monocrystalline silicon.

3. The IC of claim 1, wherein the channel structure includes monocrystalline group IV semiconductor material.

4. The IC of claim 1, wherein the channel structure includes monocrystalline group III-V semiconductor material.

5. The IC of claim 1, wherein the channel structure includes a thickness of at most 200 nm.

6. The IC of claim 1, wherein the channel structure is strained to a lattice parameter value of a top surface of the intervening layer, such that in-plane lattice parameters of the channel structure are within 30 percent of the in-plane lattice parameter of the top portion of the intervening layer.

7. The IC of claim 1, wherein the intervening layer includes a top surface dislocation density of at most 1E7 per square centimeter.

8. The IC of claim 1, wherein the first germanium concentration is at least 50 percent germanium concentration by atomic percentage.

9. The IC of claim 1, wherein the second germanium concentration is less than 35 percent germanium concentration by atomic percentage.

10. The IC of claim 1, wherein the first germanium concentration is at least 30 percent greater by atomic percentage than the second germanium concentration.

11. The IC of claim 1, wherein a transition from the first germanium concentration to the second germanium concentration includes gradual grading of germanium.

12. The IC of claim 1, wherein a transition from the first germanium concentration to the second germanium concentration is in a step-wise manner, such that the intervening layer has a multilayer structure.

13. The IC of claim 1, wherein the intervening layer includes a plurality of defects which nucleate at an interface between the substrate and the intervening layer, a majority of the defects being contained within the intervening layer such that the majority of defects are not in the channel structure, such that the channel structure has a defect/dislocation density of at most 5E4 per square cm.

14. The IC of claim 1, wherein the channel structure is one of n-type and p-type doped and the intervening layer is the other of n-type and p-type doped relative to the channel structure.

15. The IC of claim 1, wherein the channel structure includes at least a portion of the intervening layer.

16. The IC of claim 1, wherein the channel structure is a first channel structure, the IC further comprising a complementary metal-oxide-semiconductor (CMOS) circuit including a first transistor and a second transistor, the first transistor including the first channel structure, and the second transistor including a second channel structure at least partially above the intervening layer, wherein one of the first and second transistors is an n-channel transistor and the other of the first and second transistors is a p-channel transistor, wherein the n-channel transistor includes tensile strain in the corresponding channel structure and the p-channel transistor includes compressive strain in the corresponding channel structure.

17. An integrated circuit (IC), comprising:
a substrate that includes silicon;
an first layer on and in direct contact with the substrate and including silicon and germanium, the first layer having a maximum vertical thickness of at most 400 nanometers (nm);
a second layer on and in direct contact with the first layer and including monocrystalline semiconductor material, wherein the first layer is continuous from the substrate to the second layer;
a channel region including at least part of the second layer;
a gate structure at least above the channel region; a source region adjacent the channel region; and
a drain region adjacent the channel region;
wherein the first layer further has a first lattice parameter value near the substrate and a second lattice parameter value near the second layer, the first lattice parameter value being greater than the second lattice parameter value, and wherein a concentration of germanium does not generally increase along a direction from the substrate to the second layer.

18. The IC of claim 17, wherein the first lattice parameter value is at least 0.05 angstroms at 300 Kelvin greater than the second lattice parameter value, and the second lattice parameter value is at least 5.47 angstroms at 300 Kelvin.

19. An integrated circuit (IC), comprising:
a substrate that includes monocrystalline silicon;
a layer above the substrate and including monocrystalline semiconductor material;
an intervening layer between and in direct contact with the substrate and the layer, the intervening layer continuous from the substrate to the layer, and the intervening layer having a maximum vertical thickness of at most 250 nanometers (nm), the intervening layer including a first germanium concentration by atomic percentage near the substrate and a second germanium concentration by atomic percentage near the layer, wherein the first germanium concentration is at least 10 percent greater by atomic percentage than the second germanium concentration, and the second concentration is less than 35 percent germanium concentration by atomic percentage, wherein a concentration of germanium does not generally increase along a direction from the first germanium concentration to the second germanium directly;
a channel structure including at least part of the layer, the channel structure including a fin, nanowire, or nanoribbon;
a gate structure at least on top and sides of the channel structure;
a source region adjacent the channel structure; and
a drain region adjacent the channel structure, such that the channel structure is laterally between the source region and the drain region.

20. The IC of claim 1, wherein the layer has a defect/dislocation density of at most 5E4 per square cm.

* * * * *